(12) United States Patent
Lin

(10) Patent No.: US 10,798,828 B2
(45) Date of Patent: Oct. 6, 2020

(54) CIRCUIT BOARD STRUCTURES AND METHODS OF FABRICATING THE SAME

(71) Applicant: Nan Ya Printed Circuit Board Corporation, Taoyuan (TW)

(72) Inventor: Hsien-Chieh Lin, Taoyuan (TW)

(73) Assignee: NAN YA PRINTED CIRCUIT BORED CORPORATION, Taoyuan (TW)

( * ) Notice: Subject to any disclaimer, the term of this patent is extended or adjusted under 35 U.S.C. 154(b) by 0 days.

(21) Appl. No.: 16/442,303

(22) Filed: Jun. 14, 2019

(65) Prior Publication Data
US 2020/0214145 A1    Jul. 2, 2020

(30) Foreign Application Priority Data

Dec. 28, 2018 (TW) .............................. 107147584 A

(51) Int. Cl.
*H05K 1/18* (2006.01)
*H05K 3/34* (2006.01)
*H05K 3/40* (2006.01)
*H05K 1/11* (2006.01)

(52) U.S. Cl.
CPC .......... *H05K 3/4015* (2013.01); *H05K 1/111* (2013.01); *H05K 1/181* (2013.01); *H05K 3/3452* (2013.01); *H05K 2203/041* (2013.01); *H05K 2203/0723* (2013.01)

(58) Field of Classification Search
CPC .......... H05K 1/18; H05K 1/181; H05K 3/303; H05K 3/305; H05K 3/341; H05K 3/3415; H05K 3/3421; H05K 3/3426; H05K 3/3436; H05K 3/3442; H05K 3/3452

USPC .................................................. 174/262–266
See application file for complete search history.

(56) References Cited

U.S. PATENT DOCUMENTS

| | | | |
|---|---|---|---|
| 9,245,862 B1 * | 1/2016 | Nangalia | H01L 24/13 |
| 2012/0006592 A1 * | 1/2012 | Ouchi | H01L 23/49816 |
| | | | 174/267 |
| 2015/0041985 A1 * | 2/2015 | Hsieh | H01L 21/76879 |
| | | | 257/773 |

FOREIGN PATENT DOCUMENTS

CN    1980531 A    6/2007
TW    I567900 B    1/2017

OTHER PUBLICATIONS

Taiwan Patent Office, Office Action, Patent Application Serial No. 107147584, dated Aug. 12, 2019, Taiwan.

* cited by examiner

*Primary Examiner* — Jeremy C Norris

(57) ABSTRACT

A method of fabricating a circuit board structure is provided. The method includes providing a core substrate; forming an insulation layer on the core substrate; forming a patterned metal layer on the insulation layer, wherein the patterned metal layer includes a wiring layer and a pad; forming a first metal pillar on the pad, wherein the first metal pillar has a top surface; and forming a first solder resist layer on the patterned metal layer and the first metal pillar, wherein the first solder resist layer has a first opening exposing the first metal pillar, and the first opening has a bottom surface, wherein the top surface of the metal pillar is higher than or equal to the bottom surface of the first opening.

16 Claims, 19 Drawing Sheets

CIRCUIT BOARD STRUCTURES AND METHODS OF FABRICATING THE SAME

CROSS REFERENCE TO RELATED APPLICATIONS

This Application claims priority of Taiwan Patent Application No. 107147584, filed on Dec. 28, 2018, the entirety of which is incorporated by reference herein.

BACKGROUND OF THE INVENTION

Field of the Invention

The present invention relates to a circuit board structure and a method of fabricating the same, and in particular relates to a circuit board structure with a metal pillar and a method of fabricating the same.

Description of the Related Art

Circuit boards are widely used in various electronic devices. The circuit boards usually have several metal pillars arranged in an array and protruding from the top surface of a solder-resist layer. The solder material is formed on the metal pillars of the circuit board during the packaging process. Then, various electronic components are fixed on the circuit board by reflow. Each electronic component is electrically connected to each other through a wiring layer in the circuit board.

As electronic products are required to be light, thin, short, small and cheap, circuit boards are required to have a high wiring density, high product yield and low production cost. Therefore, although the existing circuit boards substantially meet the requirements of use, there is still a need to improve the circuit boards and their processes to increase the yield and the performance of the circuit board and reduce the production cost.

For example, both sides of a bottom of an opening of a solder-resist layer are susceptible to etching or surface treatment, resulting in forming a gap between a pad and a solder-resist layer. Solder materials can extend horizontally to other areas along the gap, causing short circuits and other reliability problems. The phenomenon is called solder extrusion.

BRIEF SUMMARY OF THE INVENTION

Some embodiments of the present invention provide a method of fabricating a circuit board structure. The method includes providing a core substrate; forming an insulation layer on the core substrate; forming a patterned metal layer on the insulation layer, wherein the patterned metal layer includes a wiring layer and a pad; forming a first metal pillar on the pad, wherein the first metal pillar has a top surface; and forming a first solder-resist layer on the patterned metal layer and the first metal pillar, wherein the first solder-resist layer has a first opening exposing the first metal pillar, and the first opening has a bottom surface, wherein the top surface of the first metal pillar is higher than or equal to the bottom surface of the first opening.

Some embodiments of the present invention provide a circuit board structure. The circuit board structure includes a core substrate; an insulation layer disposed on the core substrate; a patterned metal layer disposed on the insulation layer, wherein the patterned metal layer has a wiring layer and a pad; a first metal pillar disposed on the pad and the first metal pillar has a top surface; and a first solder-resist layer disposed on the patterned metal layer and the first metal pillar, and the first solder-resist layer has a first opening exposing the first metal pillar, and the first opening has a bottom surface, wherein the top surface of the first metal pillar is higher than or equal to the bottom surface of the first opening.

BRIEF DESCRIPTION OF THE DRAWINGS

Embodiments of the present invention will be described in detail below with reference to the drawings. It should be noted that in accordance with standard practice in the industry, various features are not drawn to scale and are merely illustrative. In fact, the dimensions of the elements may be arbitrarily enlarged or reduced to clearly show the features of the embodiments of the present invention, wherein.

DETAILED DESCRIPTION OF THE INVENTION

Figure 1A:
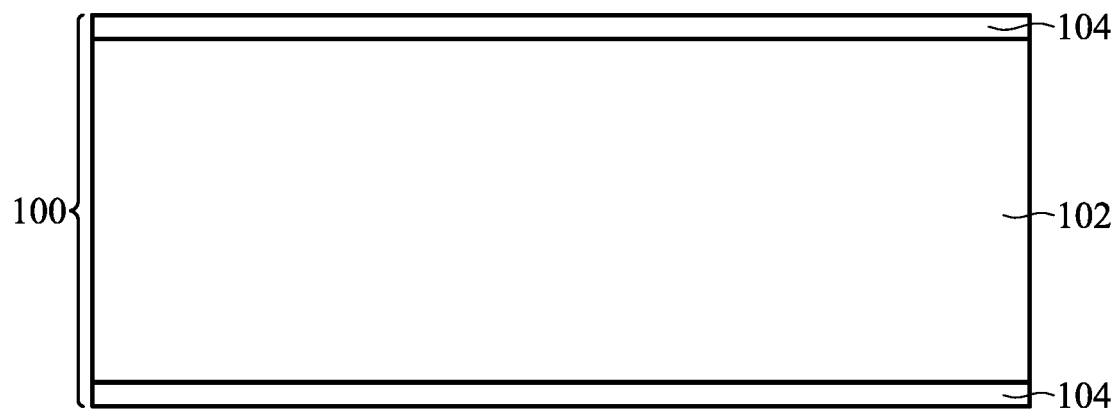
FIGS. 1A to 1K illustrate cross-sectional views of various intermediate phases of forming the circuit board structure in accordance with some embodiments of the present invention.

Several different implementation methods or examples are disclosed hereinafter to implement various features of the embodiments of the present invention. Specific elements or their arrangements are disclosed hereinafter to set forth the present invention. These embodiments are, of course, merely used for illustration and are not used to limit the scope of the present invention. For example, the formation of a first element over or on a second element in the description that follows may include embodiments in which the first and second elements are formed in direct contact, and may also include embodiments in which additional elements may be formed between the first and second elements, such that the first and second elements may not be in direct contact. In addition, reference numerals and/or letters may be repeated in the various embodiments. These repetitions are for the purpose of simplicity and clarity and do not in itself dictate a particular relationship between the various embodiments and/or configurations discussed.

Further, spatially relative terms, such as "beneath," "below," "lower," "above," "upper," and the like, may be used herein to easily describe one element's or feature's relationship to another element(s) or feature(s) as illustrated in the figures. The spatially relative terms are intended to encompass different orientations of the device in use or operation, in addition to the orientation depicted in the figures. The apparatus may be otherwise oriented (e.g., rotated 90 degrees or at other orientations) and the spatially relative descriptors used herein may likewise be interpreted accordingly.

Variations of some embodiments are described below. In various figures and illustrated embodiments, similar reference numerals are used to designate similar elements. It should be understood that additional operations may be provided before, during, and after the methods described below, and some of the operations described in the methods may be replaced or removed for other embodiments of the method.

The manufacture method of the circuit board structure of the present invention is forming a metal pillar between a solder bump and a pad. Since the metal pillar is formed between the solder bump and the pad, solder materials can be avoided from extending horizontally to other areas, thereby avoiding short circuits and other reliability problems. Furthermore, the soldering surface can also be changed from a single contact surface to several contact surfaces, thereby increasing the surface area of the contact, thus increasing the adhesion of the solder bump and reliability of the circuit board structure. In addition, forming the metal pillar prior to the formation of the solder bump can further reduce the amount of the solder material filled into the opening of the solder-resist layer. Also, when a reflow process is performed on the metal pillar, the solder bump has self-alignment function, so there is a better alignment function. Moreover, there is a non-solder mask defined (N-SMD) structure above the metal pillar; there is still a solder mask defined (SMD) structure below.

FIGS. 1A to 1K illustrate cross-sectional views of various intermediate phases of forming the circuit board structure in accordance with some embodiments of the present invention. First, FIG. 1A illustrates an initial step of the method of manufacturing a circuit board structure of the embodiments of the present invention. First, a core substrate 100 is provided. In some embodiments, the core substrate 100 may include metal-clad laminates (such as copper foil substrates), which may include a base plate 102 and metal layers 104 disposed on two opposite sides of the base plate 102. For example, the base plate 102 may include paper phenolic resin, composite epoxy, polyimide resin, glass fiber, other suitable insulation materials or a combination thereof, and the thickness may be 100 μm to 300 μm. The metal layers 104 may include copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof, and the thickness can be 5 μm to 30 μm. The metal layers 104 can be formed on the base plate 102 using any suitable method, such as sputtering, lamination, coating or a combination thereof. It should be noted that in other embodiments, the core substrate 100 is not limited to a metal-clad laminate, and may also include a single-layer board, a high density interconnection board or other suitable substrates.

Figure 1B:
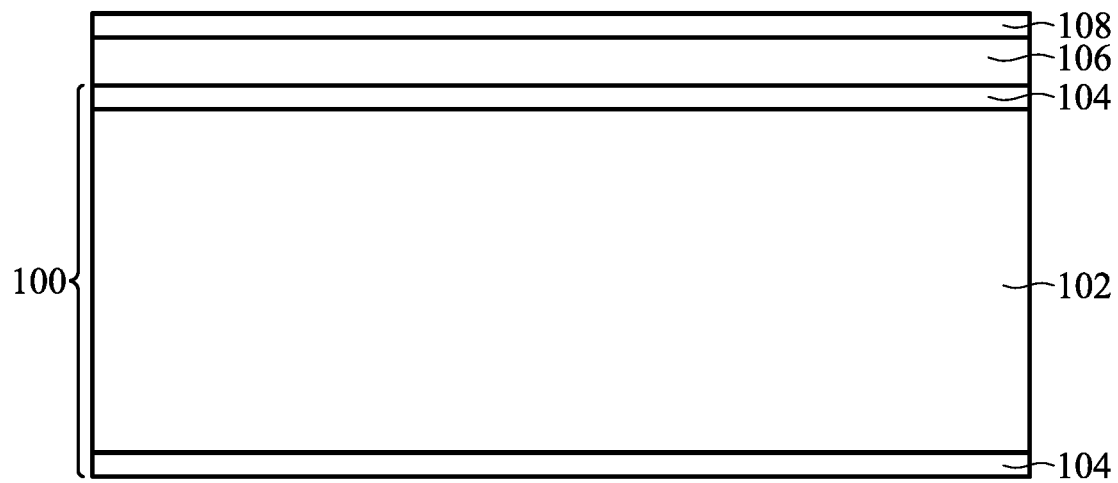

Next, referring to FIG. 1B, an insulation layer 106 is formed on the core substrate 100. In some embodiments, the insulation layer 106 can be formed through compressing an insulation material onto an upper surface of the core substrate 100. The insulation material of the insulation layer 106 may include paper phenolic resin, composite epoxy resin, polyimide resin, glass fiber, Ajinomoto Build-up Film (ABF), poly phenylene (PPE), polypropylene (PP), other suitable insulation materials or a combination thereof.

Then, a conductive layer 108 is formed on the insulation layer 106. In some embodiments, a material of the conductive layer 108 may include copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof. In some embodiments, the conductive layer 108 can be formed on the insulation layer 106 using a deposition, lamination or coating process.

Figure 1C:
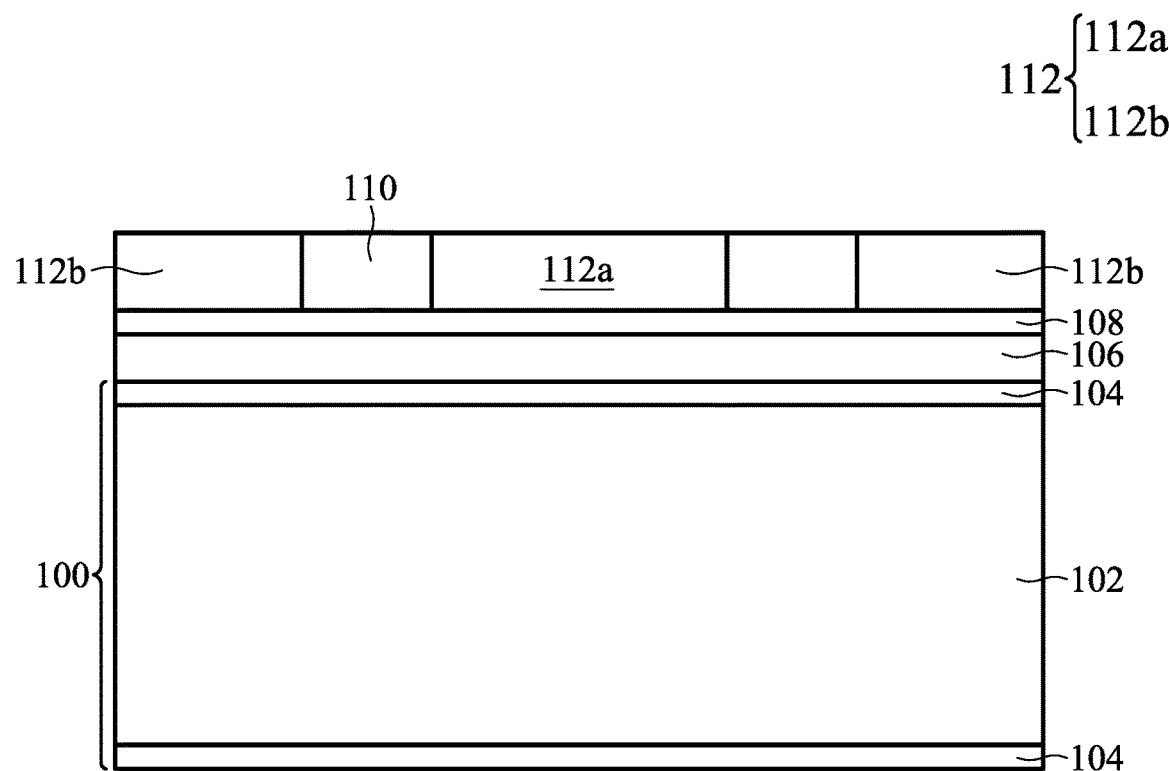

Next, referring to FIG. 1C, a patterned mask layer 110 is formed on the conductive layer 108. In some embodiments, a material of the patterned mask layer 110 may include paper phenolic resin, composite epoxy resin, polyimide resin, glass fiber, Ajinomoto Build-up Film (ABF), liquid photoresist, other suitable materials or a combination thereof. In some embodiments, an unpatterned mask layer can be formed on the conductive layer 108 using printing, spin coating, lamination, other suitable methods, or a combination thereof, and then the patterned mask layer 110 is formed by performing exposure, development processes and so on.

Then, a patterned metal layer 112 is formed on the conductive layer 108. To be specific, the patterned metal layer 112 is formed on the conductive layer 108 exposed by the patterned mask layer 110. The patterned metal layer 112 includes a pad 112a and a wiring layer 112b. In some embodiments, a material of the patterned metal layer 112 may include copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof. The patterned metal layer 112 can be formed on the conductive layer 108 using suitable methods, such as electroplating, sputtering, lamination, coating or a combination thereof. In some embodiments, the patterned metal layer 112 can be formed by performing an electroplating process using the conductive layer 108 as an electroplating start layer.

Figure 1D:
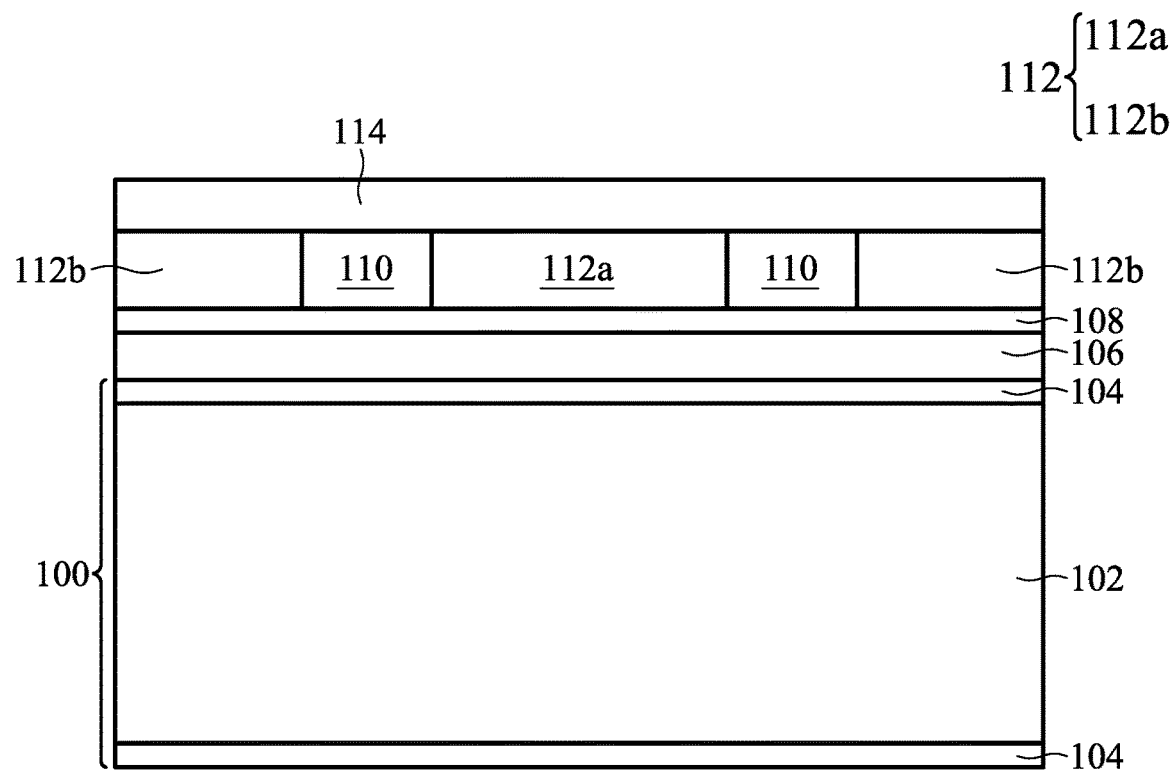

Next, referring to FIG. 1D, a mask layer 114 is formed on the patterned mask layer 110 and the patterned metal layer 112. In some embodiments, a material of the mask layer 114 may include paper phenolic resin, composite epoxy resin, polyimide resin, glass fiber, Ajinomoto Build-up Film (ABF), liquid photoresist, other suitable materials or a combination thereof. In some embodiments, the mask layer 114 can be formed on the patterned mask layer 110 and the patterned metal layer 112 using printing, spin coating, lamination, other suitable methods, or a combination thereof.

Figure 1E:
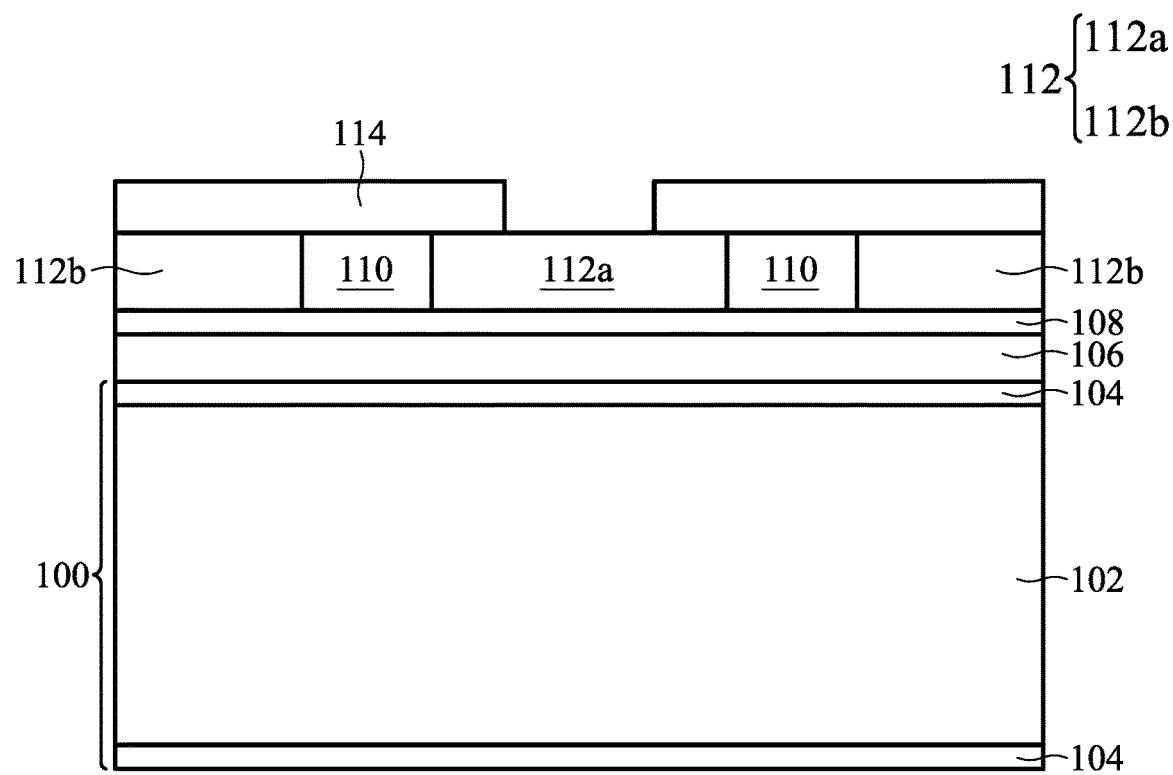

Next, referring to FIG. 1E, the mask layer 114 is patterned by performing processes such as exposure, development and so on, to expose a pad 112a.

Figure 1F:
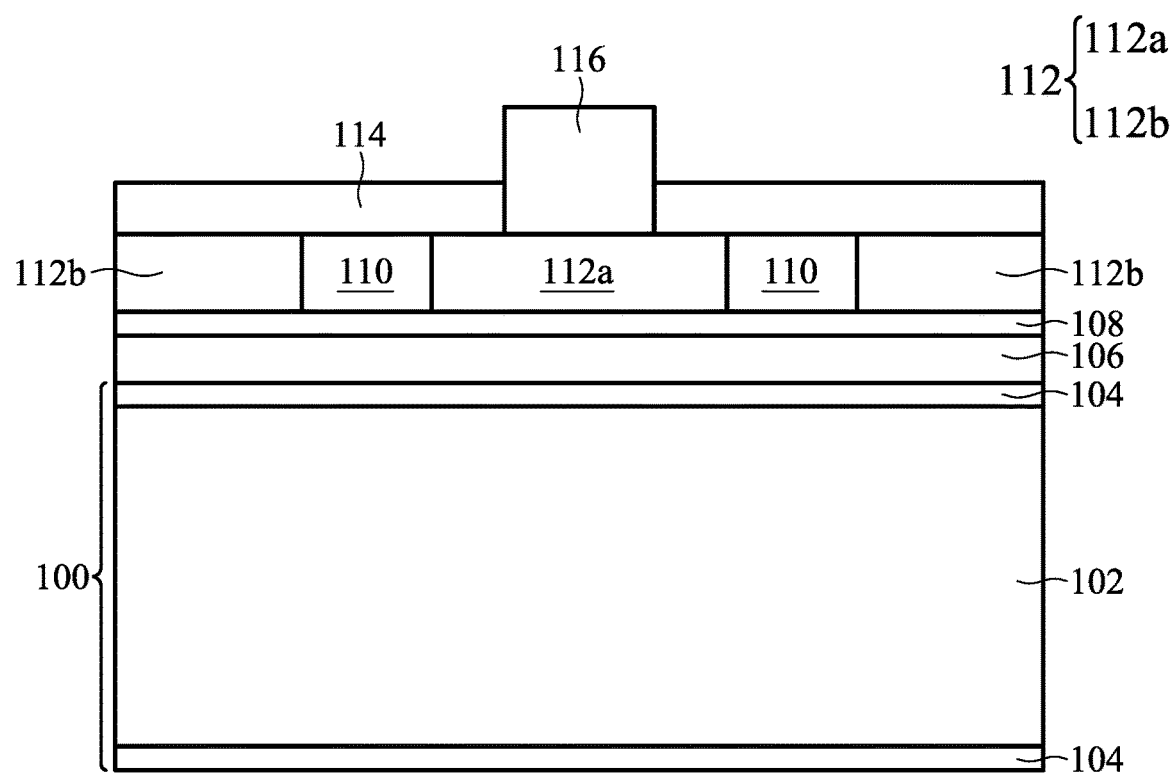

Next, referring to FIG. 1F, a first metal pillar 116 is formed on the pad 112a. To be specific, the first metal pillar 116 is formed on the pad 112a exposed by the patterned mask layer 114. In some embodiments, the first metal pillar 116 may include copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof. In a particular embodiment, the first metal pillar 116 includes copper. The first metal pillar 116 can be formed on the pad 112a using a suitable method such as electroplating, sputtering, lamination, coating or a combination thereof. In some embodiments, the first metal pillar 116 can be formed by performing an electroplating process using the pad 112a as an electroplating start layer.

In some embodiments, from a top view, the first metal pillar 116 includes the shape of a rectangle, a trapezoid, an inverted trapezoid, a T-shape, an inverted L-shape, a zigzag, a cross, a circle, an ellipse or a combination thereof. In the subsequent process of forming a solder bump, the contact area of the soldering surface can be increased thereby, further increasing the adhesion between the solder bump and the first metal pillar, thus improving the reliability and yield of the circuit board structure.

Figure 1G:
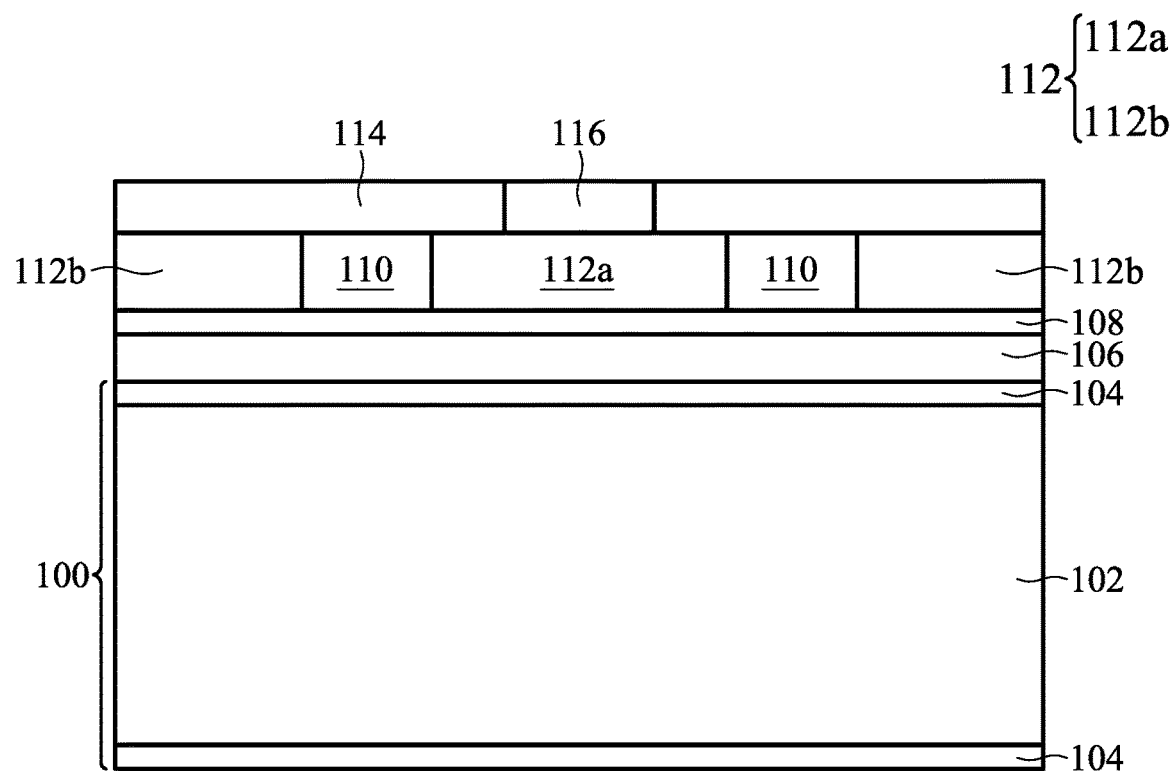

Next, referring to FIG. 1G, a brush grinding process is performed to remove a portion of the first metal pillar 116 to reduce the entire thickness of the circuit board structure. In some embodiments, a top surface of the first metal pillar 116 is coplanar with a top surface of the mask layer 114. In some embodiments, the brush grinding process also removes a portion of the mask layer 114, making the top surface of the first metal pillar 116 coplanar with the top surface of the mask layer 114.

Figure 1H:
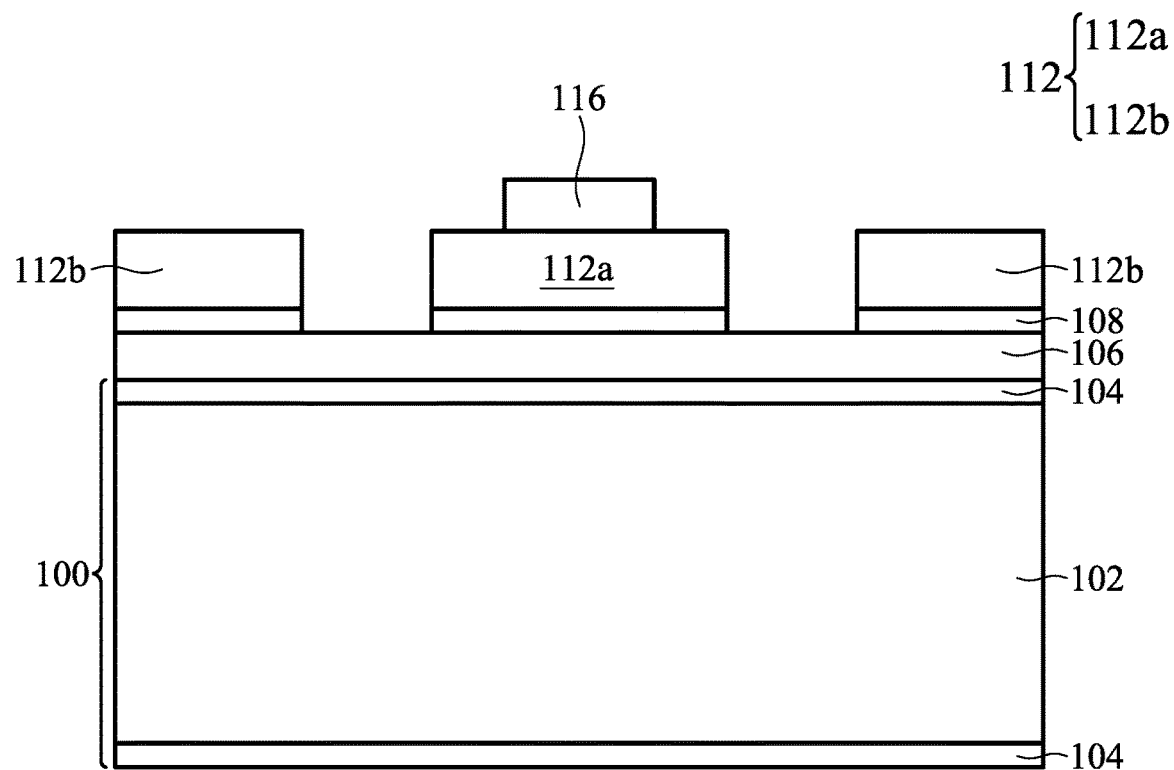

Next, referring to FIG. 1H, a stripping process is performed to remove the patterned mask layer 110 and the mask layer 114 till a portion of the conductive layer 108 is exposed. In some embodiments, the patterned mask layer 110 and the mask layer 114 can be removed using, for example, NaOH, KOH, other suitable stripping liquids or a combination thereof.

Then, an etching process is performed to remove the exposed conductive layer 108. In the embodiment where the pad 112a, wiring layer 112b and the first metal layer 116 include the same metal (for example: the pad 112a and wiring layer 112b include copper, and the first metal pillar 116 includes copper.), the aforementioned etching process can be a quick etching process, which is a selective etching process mainly biting the conductive layer 108 to remove the conductive layer 108 originally covered by the patterned mask layer 110 and to maintain sufficient thicknesses of the pad 112a and the wiring layer 112b. In other embodiments, the pad 112a and the wiring layer 112b include a different metal than that of the first metal pillar 116 (for example: the pad 112a and wiring layer 112b include nickel, and the first metal pillar 116 includes copper.); therefore, the etch selectivity can be increased in the aforementioned etching process, and after the conductive layer 108 originally covered by the patterned mask layer 110, sufficient thicknesses of the pad 112a and the wiring layer 112b are still maintained.

Figure 1I:
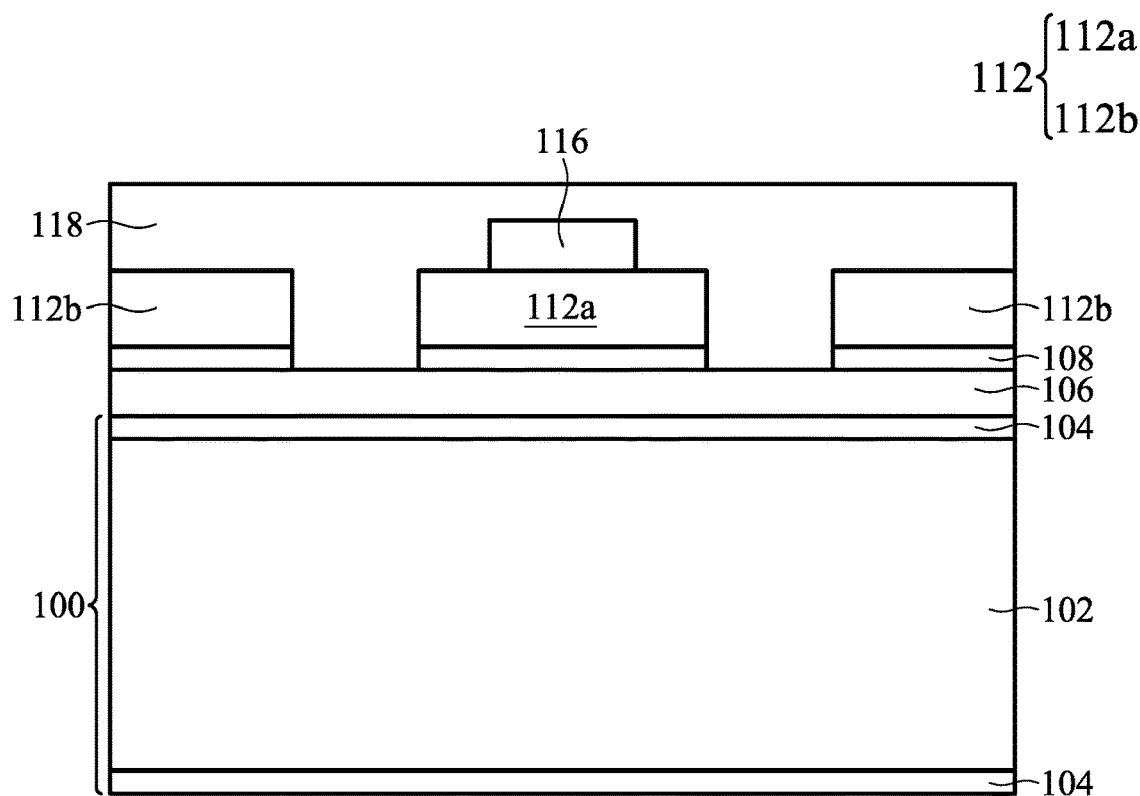

Next, referring to FIG. 1I, a first solder-resist layer 118 is formed on the patterned metal layer 112 and the first metal pillar 116. In some embodiments, the first solder-resist layer 118 can be formed by coating a photosensitive solder-resist material, such as epoxy resin, carbamic acid, urethane resin or the like, on the patterned metal layer 112 and the first metal pillar 116, followed by curing the solder-resist material. The first metal pillar 116 has a top surface 116T distal from the core substrate 100 and a bottom surface close to the core substrate.

Figure 1J:
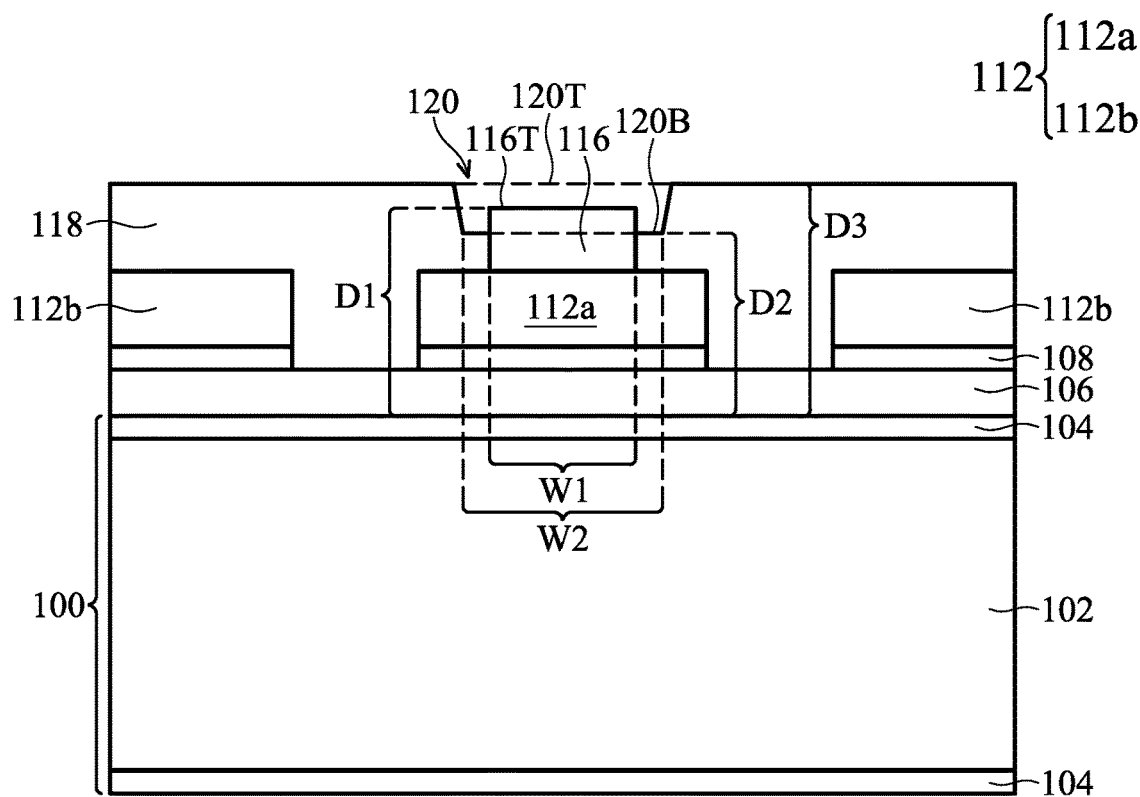

Next, referring to FIG. 1J, a portion of the first solder-resist layer 118 is etched by an etching process, which makes the first solder-resist layer 118 have a first opening 120 exposing the first metal pillar 116. The first opening 120 has a top surface 120T distal from the core substrate 100 and a bottom surface 120B close to the core substrate 100. In some embodiments, the top surface 120T of the first opening 120 is wider than the bottom surface 120B of the first opening 120. In some embodiments, the top surface 116T of the first metal pillar 116 is higher than or equal to the bottom surface 120B of the first opening 120; in other words, the top surface 116T of the first metal pillar 116 is not lower than the bottom surface 120B of the first opening 120. To be specific, there is a first distance D1 between the top surface 116T of the first metal pillar 116 and the top surface of the core substrate 100, and there is a second distance D2 between the bottom surface 120B of the first opening 120 and the core substrate 100, wherein the first distance D1 is greater than or equal to the second distance D2; in other words, the first distance D1 is not smaller than the second distance D2.

In some embodiments, the first metal pillar 116 does not protrude from a top surface of the first solder-resist layer 118. In other words, in some embodiments, the top surface 116T of the first metal pillar 116 is lower than or equal to the top surface 120T of the first opening 120. To be specific, there is a third distance D3 between the top surface 120T of the first opening 120T and the top surface of the core substrate 100, wherein the first distance D1 is smaller than or equal to the third distance D3; in other words, the first distance D1 is not greater than the third distance D3.

On the same plane of the bottom surface 120B of the first opening 120, the first metal pillar 116 has a first width W1 parallel to the top surface of the core substrate 100, and the bottom surface 120B has a second width W2 parallel to the top surface of the core substrate 100. In some embodiments, the first width W1 of the first metal pillar 116 is smaller than or equal to the second width W2 of the bottom surface 120B of the first opening 120; in other words, the first width W1 of the first metal pillar 116 is not greater than the second width W2 of the bottom surface 120B of the first opening 120.

Figure 1K:
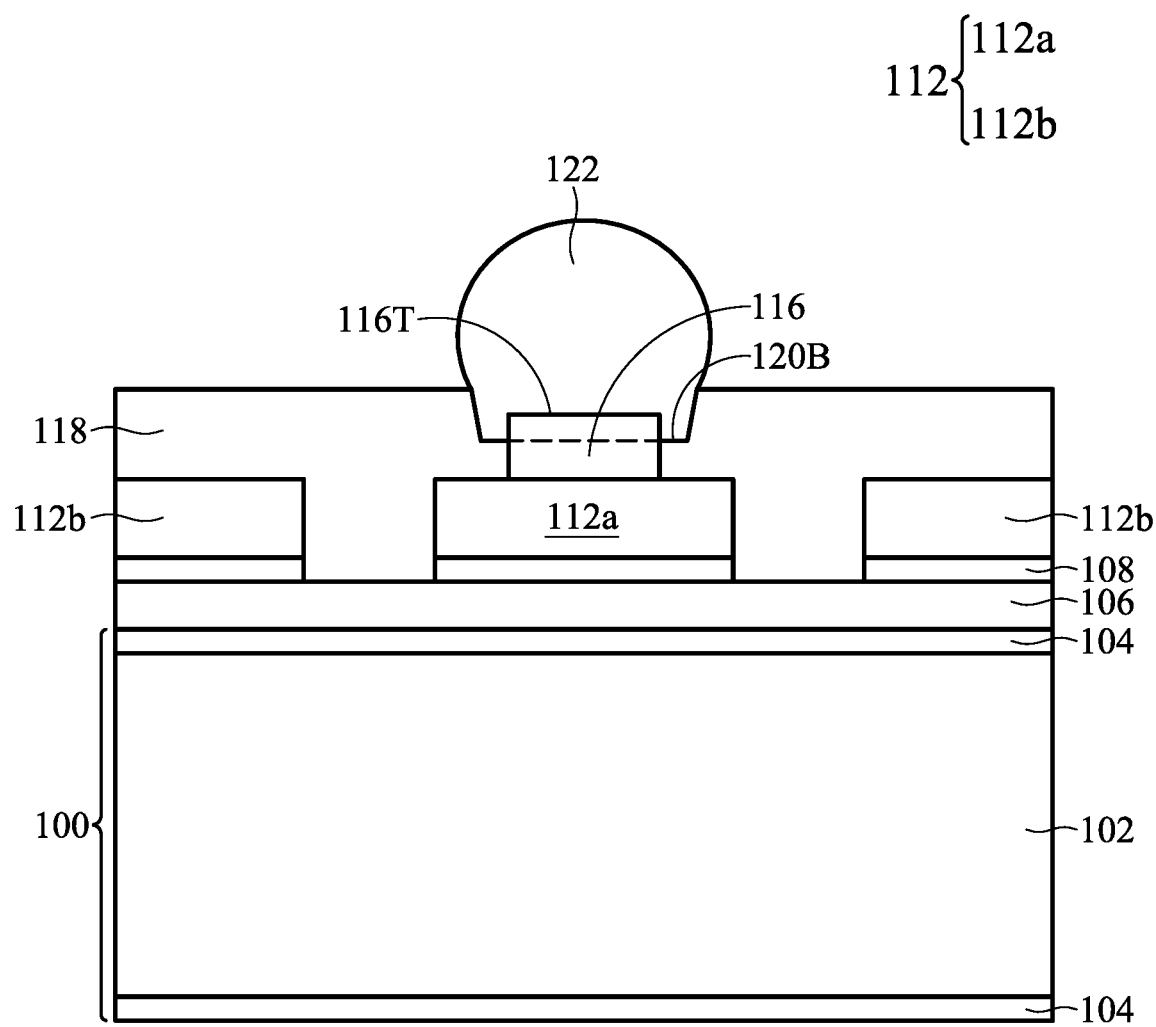

Next, referring to FIG. 1K, a solder material is coated on the first metal pillar 116. Then, the solder material is heated to form the solder material into a solder bump 122.

In the embodiments of the present invention, since the first metal pillar 116 is formed between the pad 112a and the solder bump 122, it makes the liquefied solder material flow along the sidewall of the first metal pillar 116 when the solder material is subsequently heated. Therefore, the liquefied solder material does not extend in a horizontal direction and does not have undesired electrical connection with other elements, further avoiding the problem of solder extrusion.

When the top surface 116T of the first metal pillar 116 contacting the solder bump 122 is higher than the bottom surface 120B of the first opening 120, the contact area of the soldering surface can be increased, further increasing the adhesion between the solder bump and the first metal pillar, thus improving the reliability and yield of the circuit board structure.

Furthermore, since in some embodiments of the present invention, the mask layer 114 is patterned using processes such as exposure, development and so on, and then the first metal pillar 116 is formed, the pitch between the first metal pillars 116 can be further reduced, thereby reducing the size of the circuit board structure.

In addition, forming the metal pillar prior to the formation of the solder bump can further reduce the amount of the solder material filled into the opening of the solder-resist layer. Also, when a reflow process is performed on the metal pillar, the solder bump has self-alignment function, so there is a better alignment function. Moreover, there is a non-solder mask defined (N-SMD) structure above the metal pillar; there is still a solder mask defined (SMD) structure below.

Figure 2A:
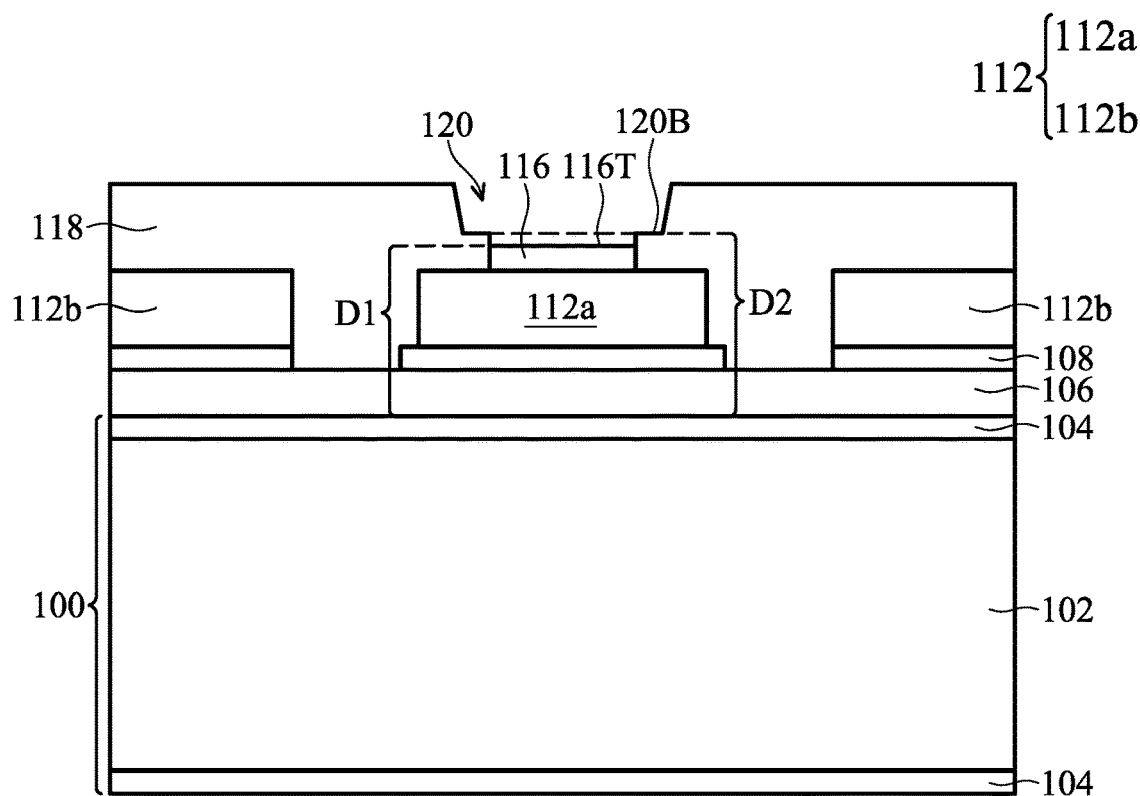
FIGS. 2A and 2B illustrate cross-sectional views of various intermediate phases of forming the circuit board structure in accordance with some embodiments of the present invention.
Figure 2B:
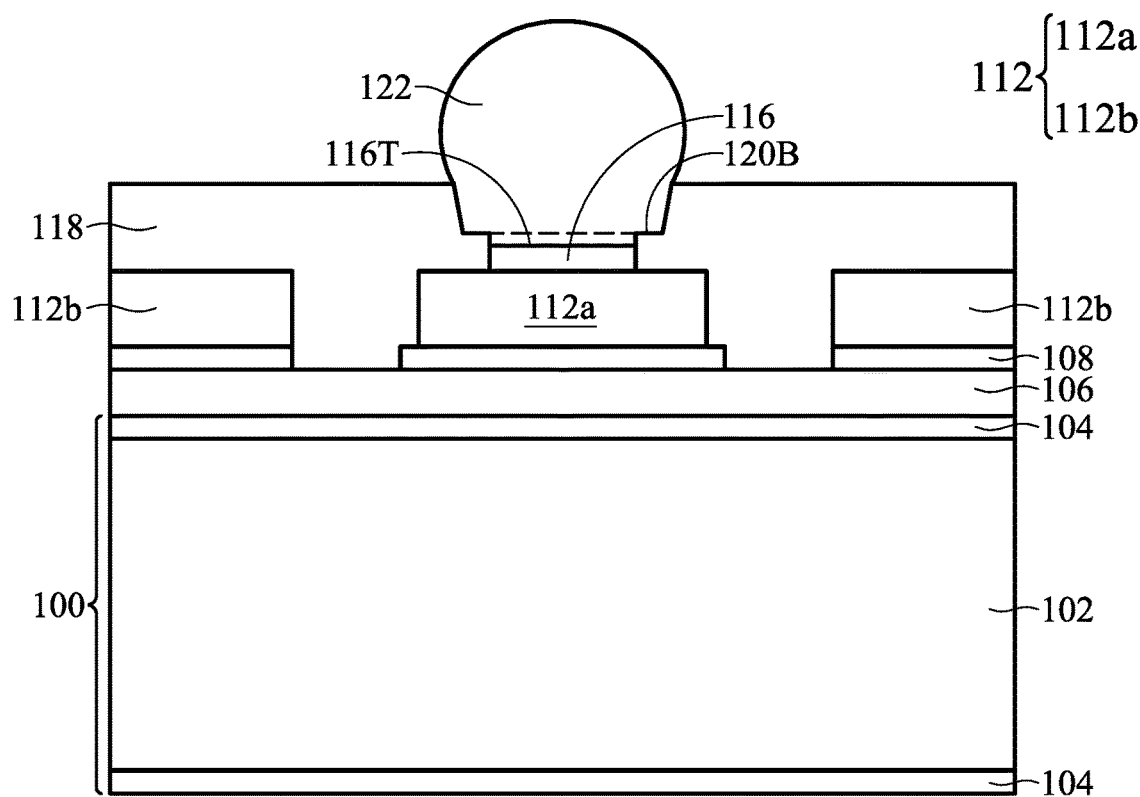

FIGS. 2A to 2B illustrate cross-sectional views of various intermediate phases of forming the circuit board structure in accordance with some embodiments of the present invention. It should be noted that the same or similar elements or layers that correspond to those of FIGS. 1A to 1K are denoted by similar reference numerals. In some embodiments, the elements or layers denoted by the same or similar reference numerals have the same meanings, which will not be repeated for the purpose of simplicity.

FIG. 2A is a circuit board structure following FIG. 1J. Referring to FIG. 2A, an etching process is performed to remove a portion of the first metal pillar 116, making the top surface 116T of the first metal pillar 116 lower than the bottom surface 120B of the first opening 120. To be specific, the first distance D1 is smaller than the second distance D2.

In some embodiments, from a top view, the first metal pillar 116 has the shape of a rectangle, a trapezoid, an inverted trapezoid, a T-shape, an inverted L-shape, a zigzag, a cross, a circle, an ellipse or a combination thereof. In the subsequent process of forming a solder bump, the contact area of the soldering surface can be increased thereby, further increasing the adhesion between the solder bump and the first metal pillar, thus improving the reliability and yield of the circuit board structure.

Next, referring to FIG. 2B, a solder material is coated on the first metal pillar 116. Then, the solder material is heated to form the solder material into a solder bump 122.

Figure 3A:
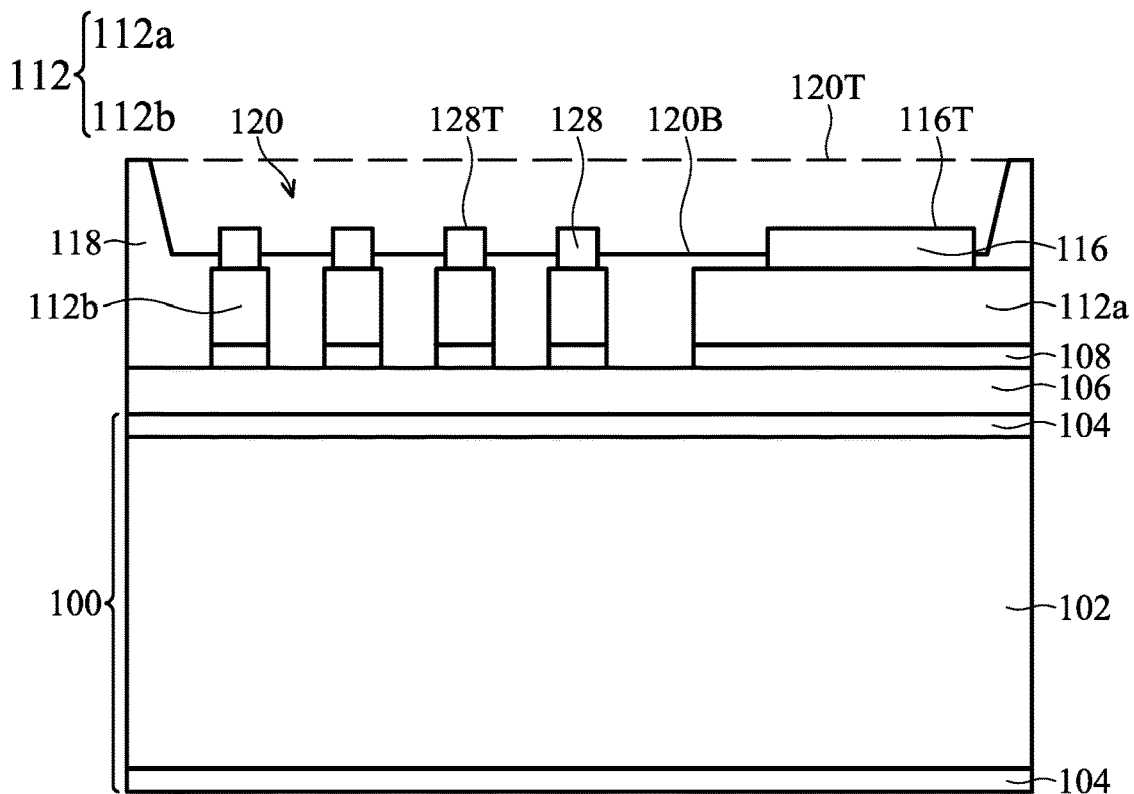
FIGS. 3A and 3B illustrate cross-sectional views of various intermediate phases of forming the circuit board structure in accordance with some embodiments of the present invention.
Figure 3B:
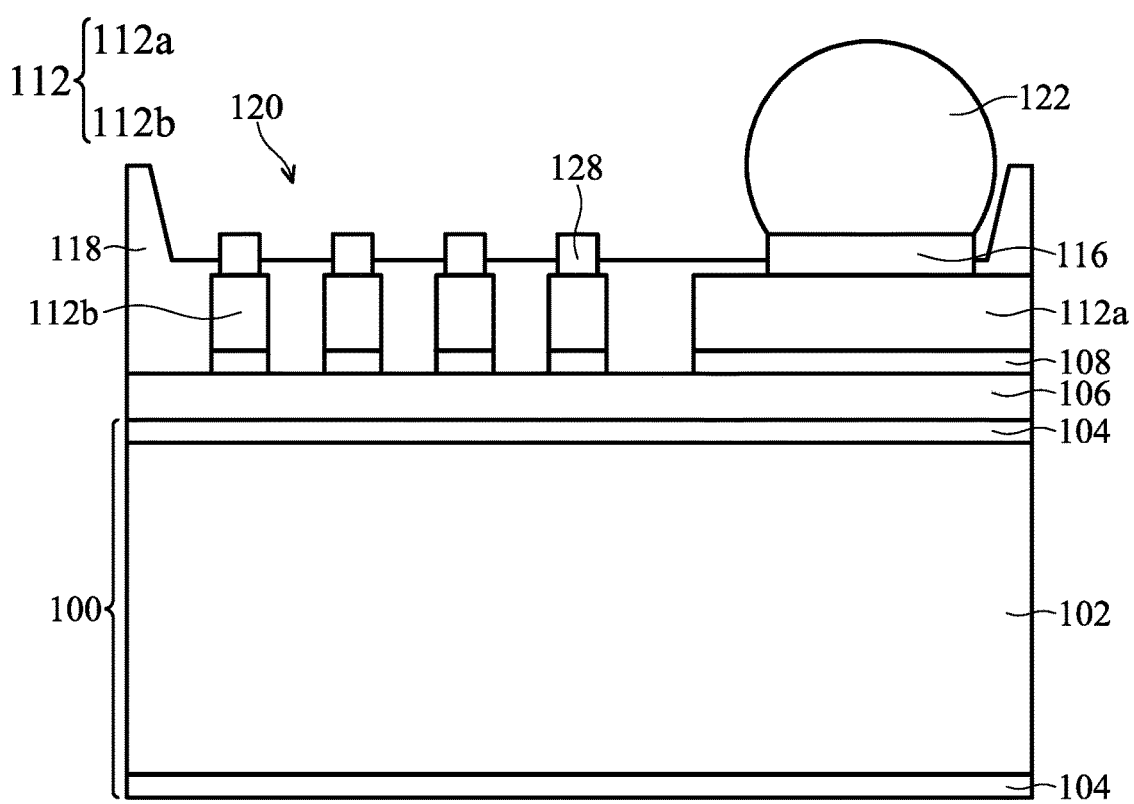

FIGS. 3A and 3B illustrate cross-sectional views of various intermediate phases of forming the circuit board structure in accordance with other embodiments of the present invention. It should be noted that the same or similar elements or layers that correspond to those of FIGS. 1A to 1K are denoted by similar reference numerals. In some embodiments, the elements or layers denoted by the same or similar reference numerals have the same meanings, which will not be repeated for the purpose of simplicity.

The circuit board structure of FIG. 3A is formed using the same processes as those in FIGS. 1A to 1J. In order to more significantly distinguish the pad 112a and the wiring layer 112b of the patterned metal layer 112, the patterned metal layer 112 is illustrated in another arrangement in FIG. 3A. Referring to FIG. 3A, in the process of forming the first metal layer 116 on the pad 112a, a second metal pillar 128 is also formed on the wiring layer 112b. The first opening 120 of the first solder-resist layer 118 exposes the first metal pillar 116 and the second metal pillar 128. The second metal pillar 128 has a top surface 128T distal from the core substrate 100 and a bottom surface close to the core substrate 100. In some embodiments, the top surface 128T of the second metal pillar 128 is higher than or equal to the bottom surface 120B of the first opening 120.

In some embodiments, the second metal pillar 128 does not protrude from the top surface of the first solder-resist layer 118. In other words, in some embodiments, the top surface 128T of the second metal pillar 128 is lower than or equal to the top surface 120T of the first opening.

Next, referring to FIG. 3B, a solder material is coated on the first metal pillar 116. Then, the solder material is heated to form the solder material into a solder bump 122.

In some embodiments, from a top view, the second metal pillar 128 includes the shape of a rectangle, a trapezoid, an inverted trapezoid, a T-shape, an inverted L-shape, a zigzag, a cross, a circle, an ellipse or a combination thereof. In the subsequent process, the contact area can be increased thereby, further increasing the adhesion with the second metal pillar, thus improving the reliability and yield of the circuit board structure.

Since the second metal pillar 128 is formed on the wiring layer 112b, in the subsequent process, a better adhesion can also be provided.

FIGS. 4A to 4F show cross-sectional views of various intermediate phases of forming the circuit board structure in accordance with other embodiments of the present invention. It should be noted that the same or similar elements or layers that correspond to those of FIGS. 1A to 1K are denoted by similar reference numerals. In some embodiments, the elements or layers denoted by the same or similar reference numerals have the same meanings, which will not be repeated for the purpose of simplicity.

Figure 4A:
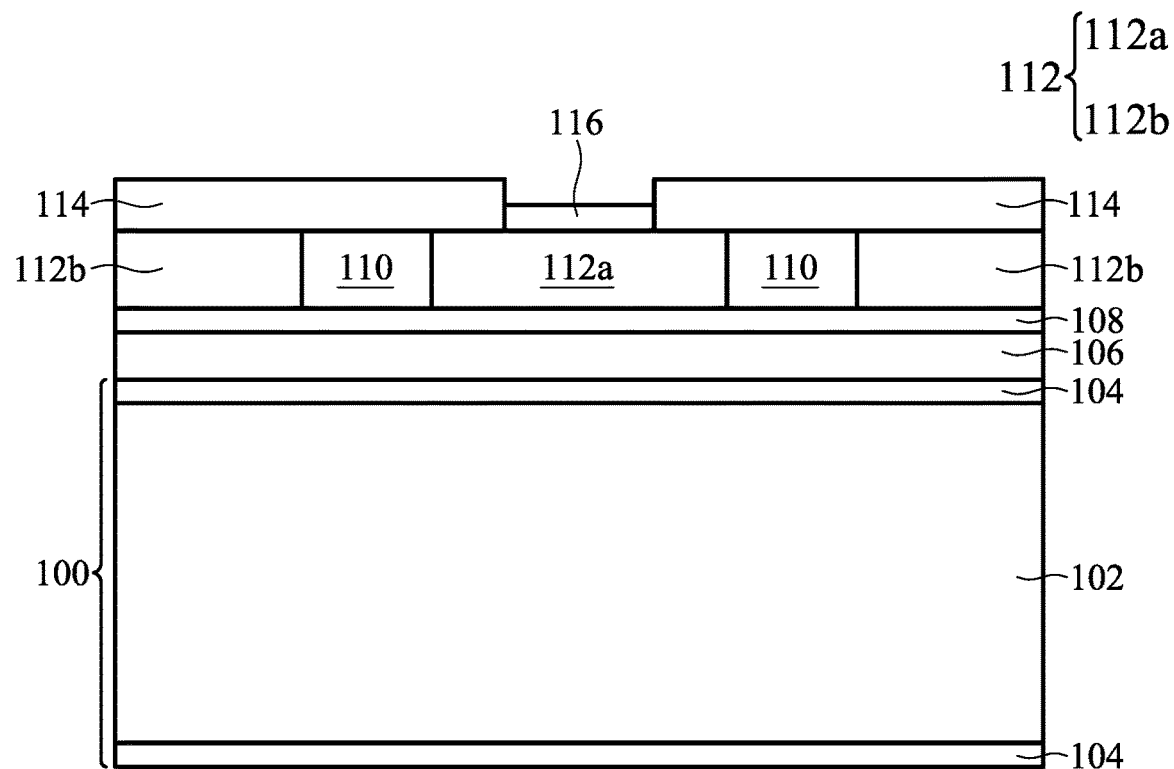
FIGS. 4A to 4F illustrate cross-sectional views of various intermediate phases of forming the circuit board structure in accordance with some embodiments of the present invention.

FIG. 4A is a circuit board structure following FIG. 1E. Referring to FIG. 4A, a first metal pillar 116 is formed on the pad 112a. To be specific, a first metal pillar 116 is formed on the pad 112a exposed by the patterned mask layer 114, and the first metal pillar 116 does not protrude from the patterned mask layer 114. Alternatively, with respect to the core substrate, the top surface of the first metal layer 116 is not higher than the top surface of the patterned mask layer 114. The first metal pillar 116 can be formed on the pad 112a using a suitable method, such as electroplating, sputtering, lamination, coating or a combination thereof. In some embodiments, the first metal pillar 116 can be formed by performing an electroplating process using the pad 112a as an electroplating start layer.

In some embodiments, from a top view, the first metal pillar 116 includes the shape of a rectangle, a trapezoid, an inverted trapezoid, a T-shape, an inverted L-shape, a zigzag, a cross, a circle, an ellipse or a combination thereof. In the subsequent process of forming a solder bump, the contact area of the soldering surface can be increased thereby, further increasing the adhesion between the solder bump and the first metal pillar, thus improving the reliability and yield of the circuit board structure.

Figure 4B:
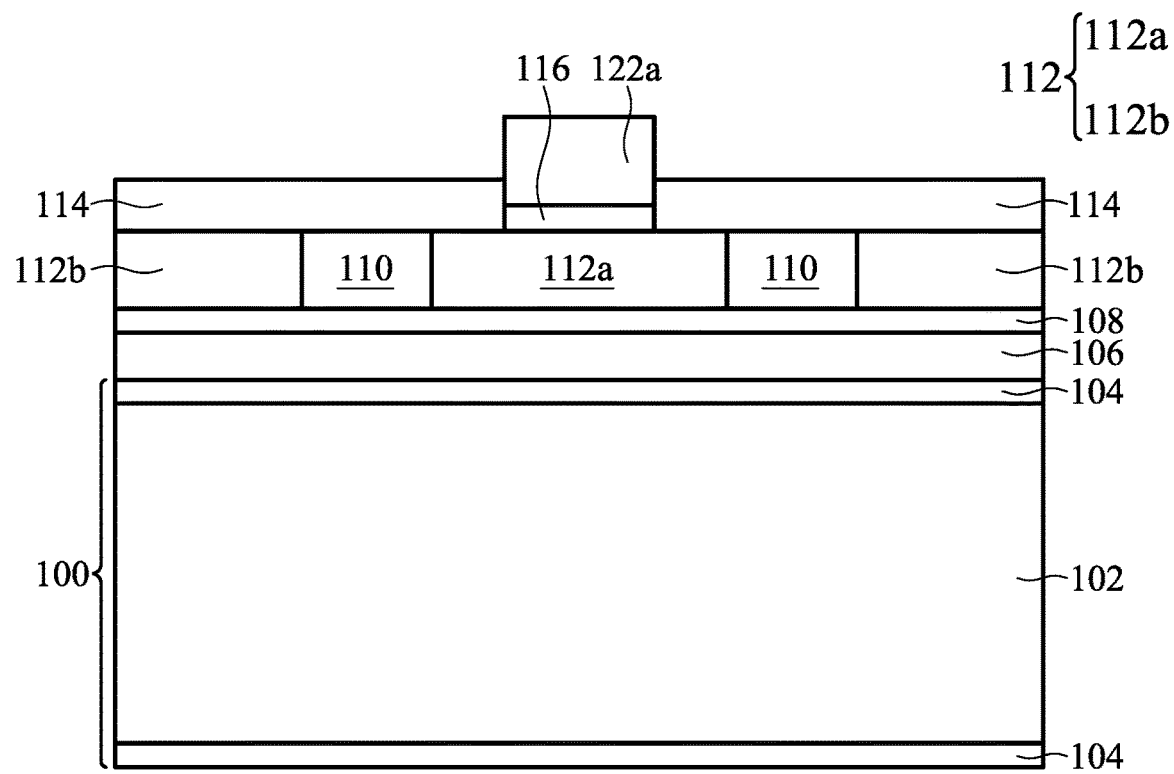

Next, referring to FIG. 4B, a solder material 122a is formed on the first metal pillar 116. The solder material 122a can be formed on the first metal pillar 116 using a suitable method, such as electroplating, sputtering, lamination, coating or a combination thereof. In some embodiments, the solder material 122a can be formed by performing an electroplating process using the first metal layer 116 as an electroplating start layer.

Figure 4C:
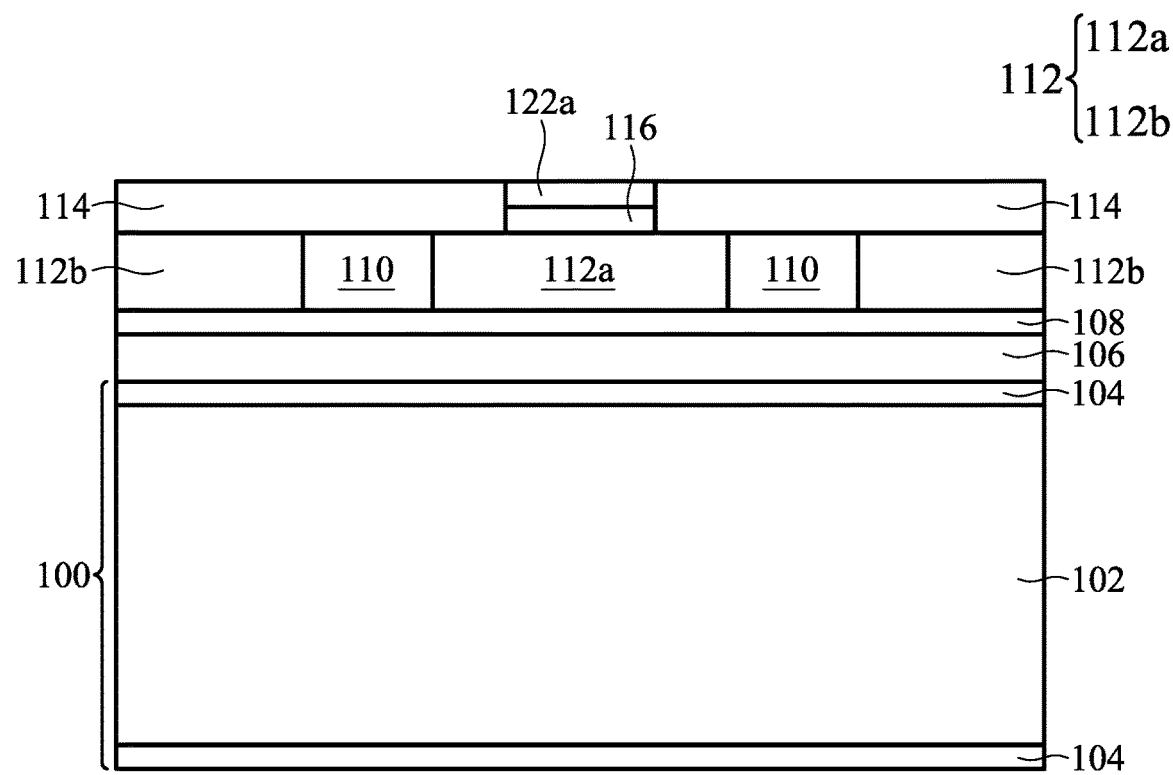

Next, referring to FIG. 4C, a brush grinding process is performed to remove a portion of the solder material 122a to make a top surface of the solder material 122a coplanar with the top surface of the mask layer 114. In some embodiments, the brush grinding process also removes a portion of the mask layer 114, making the top surface of the first metal pillar 116 coplanar with the top surface of the mask layer 114.

Figure 4D:
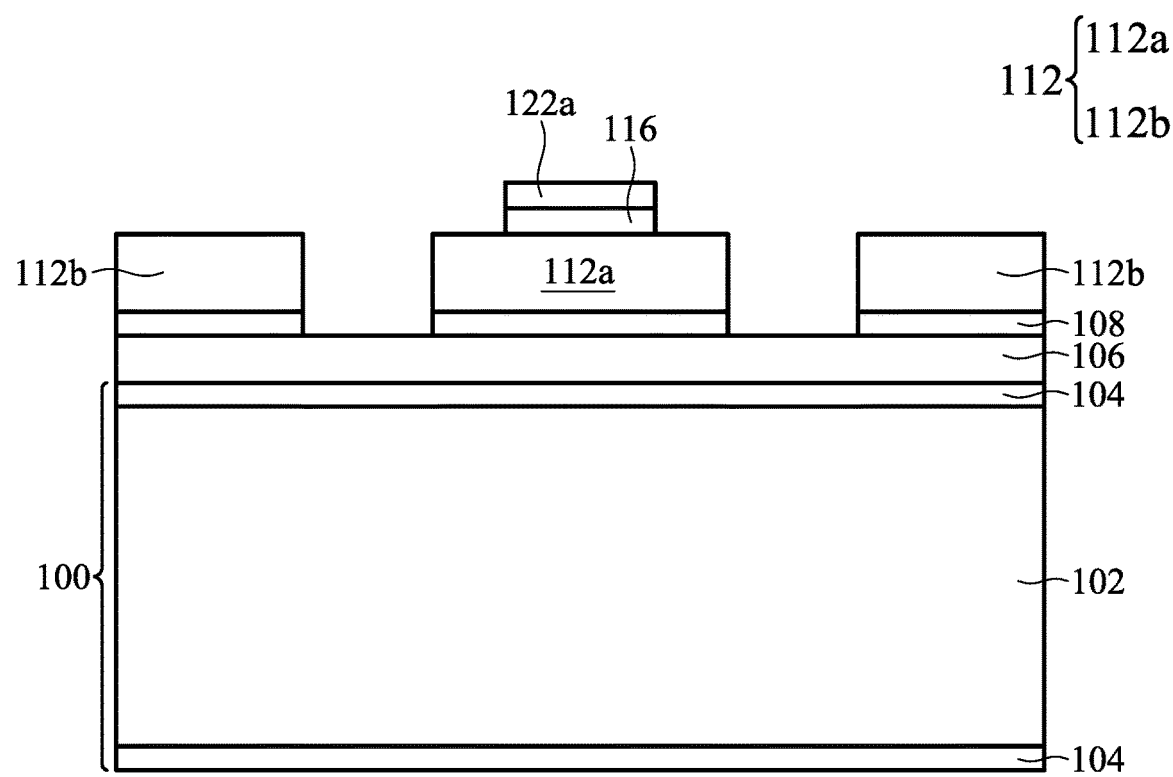

Next, referring to FIG. 4D, a stripping process is performed to remove the patterned mask layer 110 and the mask layer 114 till a portion of the conductive layer 108 is exposed. In some embodiments, the patterned mask layer 110 and the mask layer 114 can be removed using, for example, NaOH, KOH, other suitable stripping liquids or a combination thereof.

Then, an etching process is performed to remove the exposed conductive layer 108. The aforementioned etching process can be a quick etching process, which is a selective etching process mainly biting the conductive layer 108 to remove the conductive layer 108 originally covered by the patterned mask layer 110 and to maintain sufficient thicknesses of the pad 112a and the wiring layer 112b.

Figure 4E:
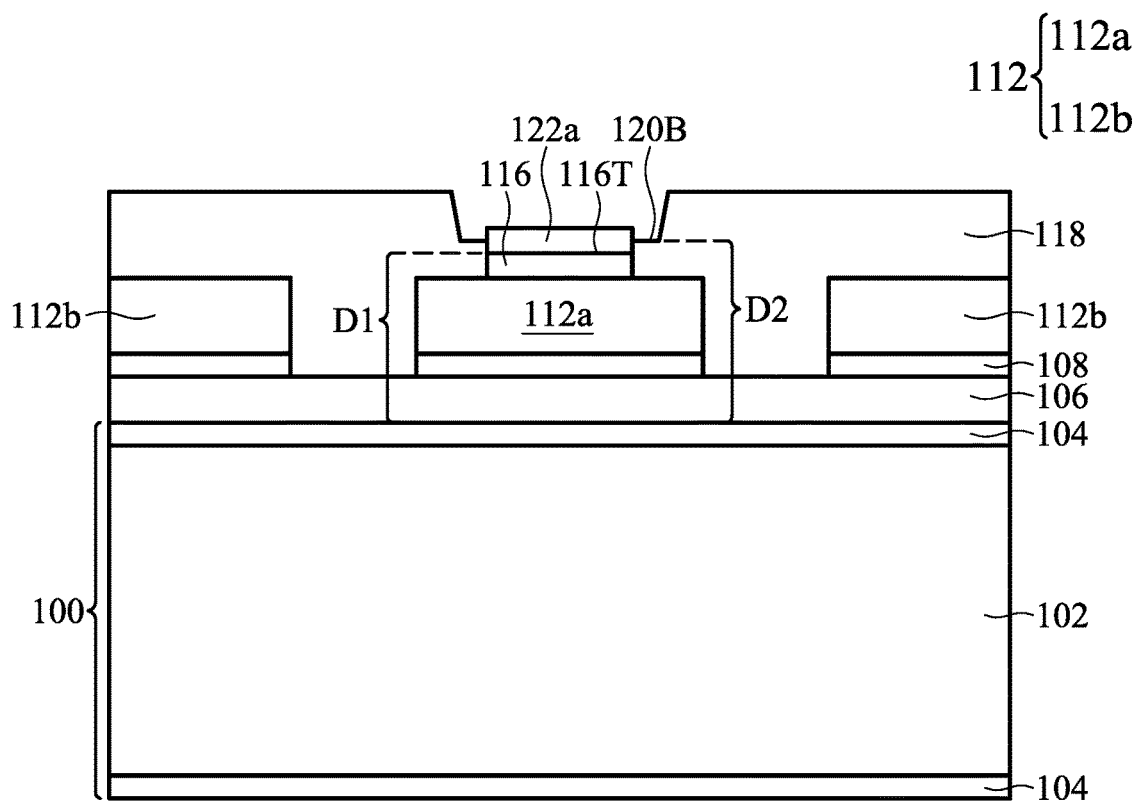

Next, referring to FIG. 4E, a first solder-resist layer 118 is formed on the patterned metal layer 112 and the solder material 122a. In some embodiments, the first solder-resist layer 118 can be formed by coating a photosensitive solder-resist material, such as epoxy resin, carbamic acid, urethane resin or the like, on the patterned metal layer 112 and the solder material 122a, followed by curing the solder-resist material.

Then, a portion of the first solder-resist layer 118 is etched by an etching process, which makes the first solder-resist layer 118 have a first opening 120 exposing the solder material 122a. In some embodiments, the top surface 120T of the first opening 120 is wider than the bottom surface 120B of the first opening 120. The top surface 116T of the first metal pillar 116 is lower than the bottom surface 120B of the first opening 120. To be specific, the first distance D1 is smaller than the second distance D2.

Figure 4F:
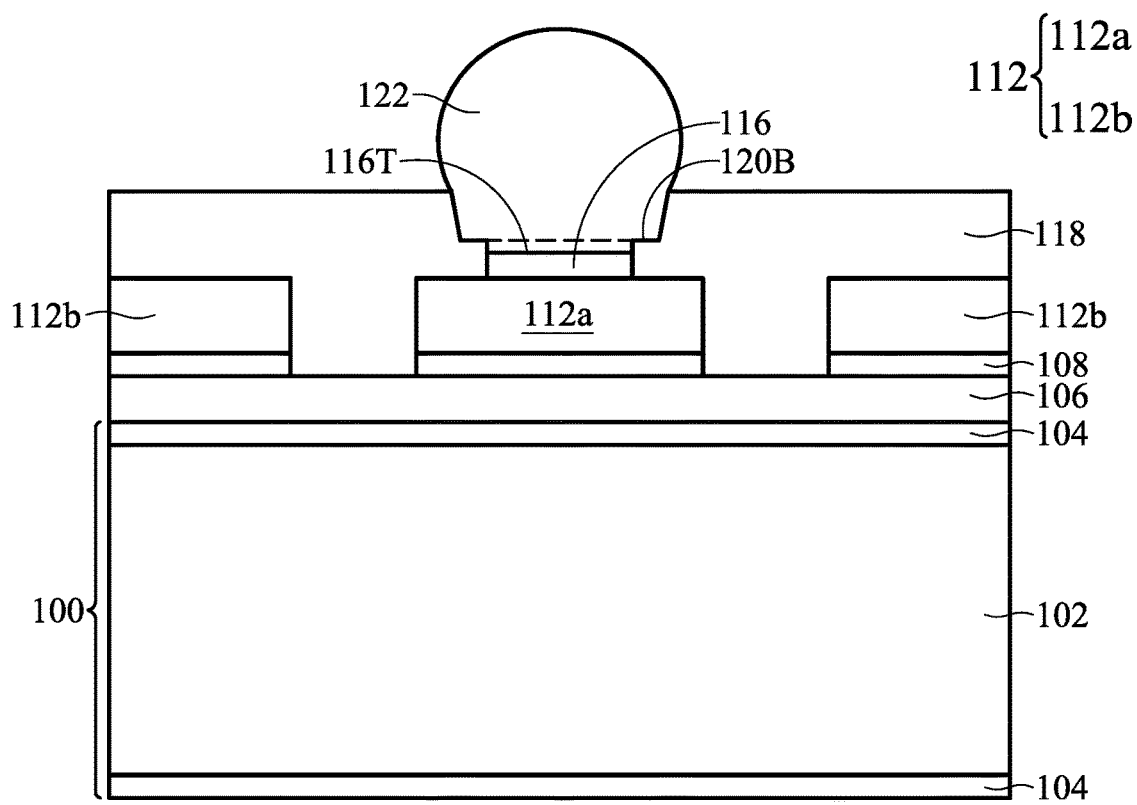

Next, referring to FIG. 4F, the solder material 122a is heated to form the solder material 122a into a solder bump 122.

FIGS. 5A to 5D illustrate cross-sectional views of various intermediate phases of forming the circuit board structure in accordance with other embodiments of the present invention. It should be noted that the same or similar elements or layers that correspond to those of FIGS. 1A to 1K are denoted by similar reference numerals. In some embodiments, the elements or layers denoted by the same or similar reference numerals have the same meanings, which will not be repeated for the purpose of simplicity.

Figure 5A:
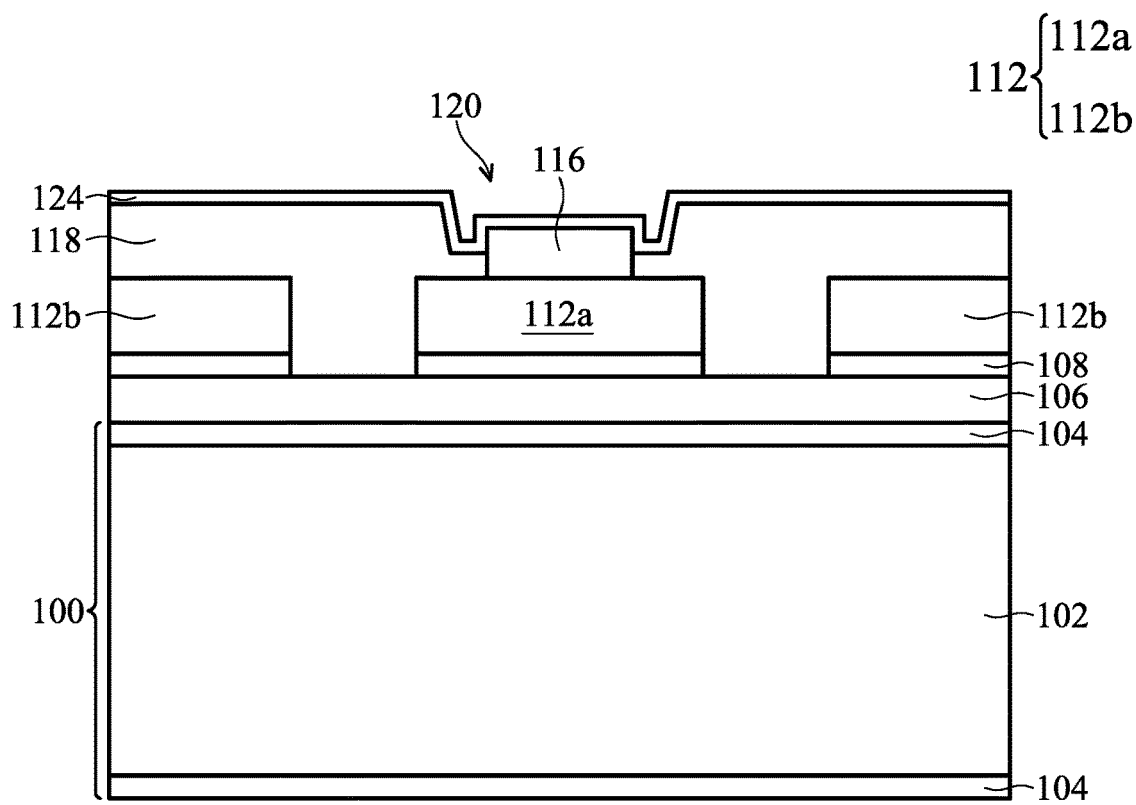
FIGS. 5A to 5D illustrate cross-sectional views of various intermediate phases of forming the circuit board structure in accordance with some embodiments of the present invention.

FIG. 5A follows FIG. 1J. Referring to FIG. 5A, a conductive layer 124 is formed on the first solder-resist layer 118 and the first metal pillar 116 and in the first opening 120 of the first solder-resist layer 118. To be specific, the conductive layer 124 is formed conformally on the surface profile of the circuit board structure. In some embodiments, a material of the conductive layer 124 can be copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof. In some embodiments, the conductive layer 124 can be formed on the first solder-resist layer 118 and the first metal pillar 116 using a deposition, lamination or coating process.

Figure 5B:
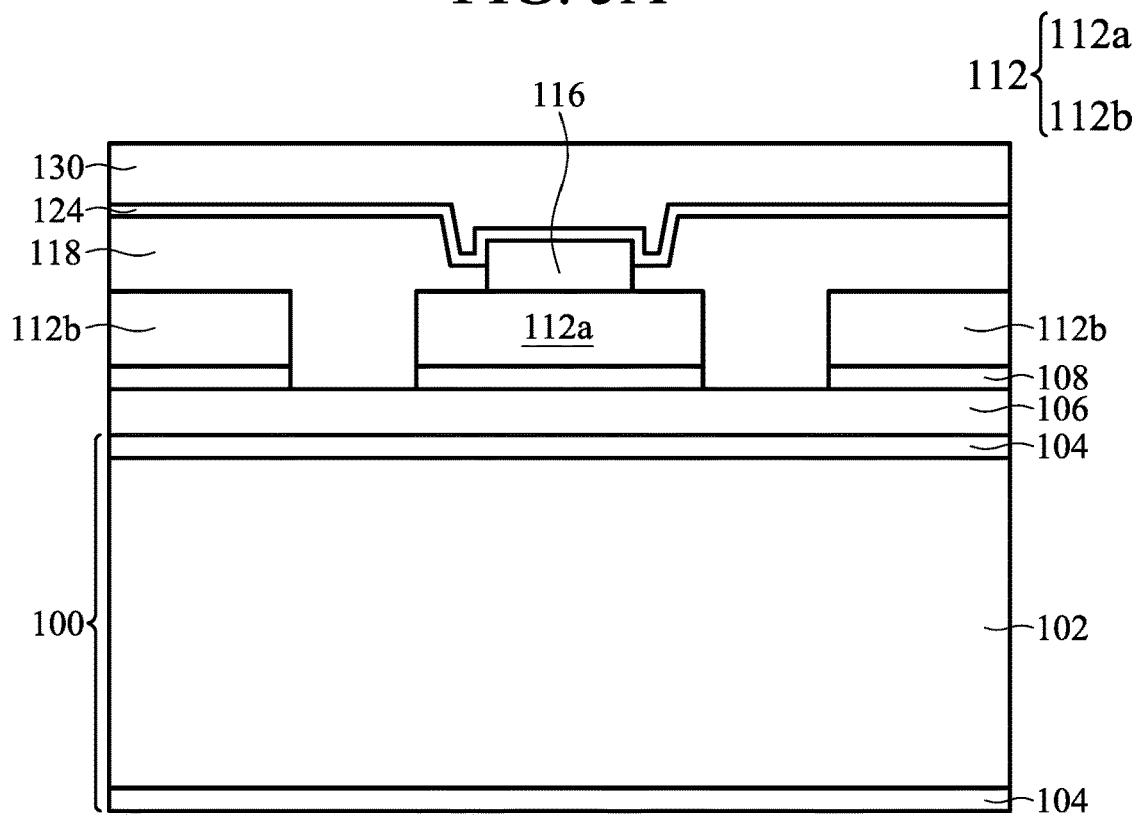

Next, referring to FIG. 5B, a metal layer 130 is formed on the conductive layer 124. The metal layer 130 can be formed on the conductive layer 124 using a suitable method, such as electroplating, sputtering, lamination, coating or a combination thereof. In some embodiments, the metal layer 130 can be formed by performing an electroplating process using the conductive layer 124 as an electroplating start layer.

Figure 5C:
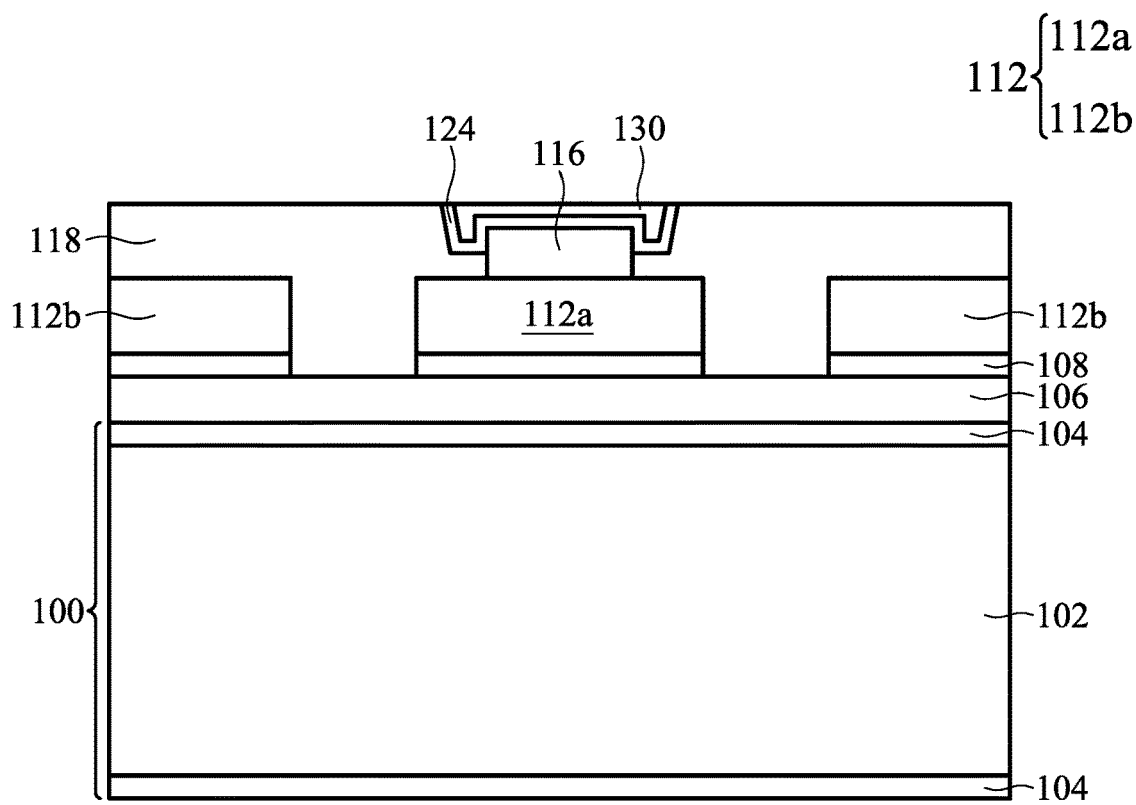

Next, referring to FIG. 5C, a brush grinding process is performed to remove a portion of the conductive layer 124 and the metal layer 130 to make a top surface of the solder material 122a coplanar with the top surface of the first solder-resist layer 118. To be specific, the brush grinding process is performed to remove the conductive layer 124 and the metal layer 130 outside the first opening 120 of the first solder-resist layer 118.

In some embodiments, a surface treatment process can be performed to the metal layer 130. From a top view, the first metal pillar 116 includes the shape of a rectangle, a trapezoid, an inverted trapezoid, a T-shape, an inverted L-shape, a zigzag, a cross, a circle, an ellipse or a combination thereof. In the subsequent process of forming a solder bump, the contact area of the soldering surface can be increased thereby, further increasing the adhesion between the solder bump and the first metal pillar, thus improving the reliability and yield of the circuit board structure.

Figure 5D:
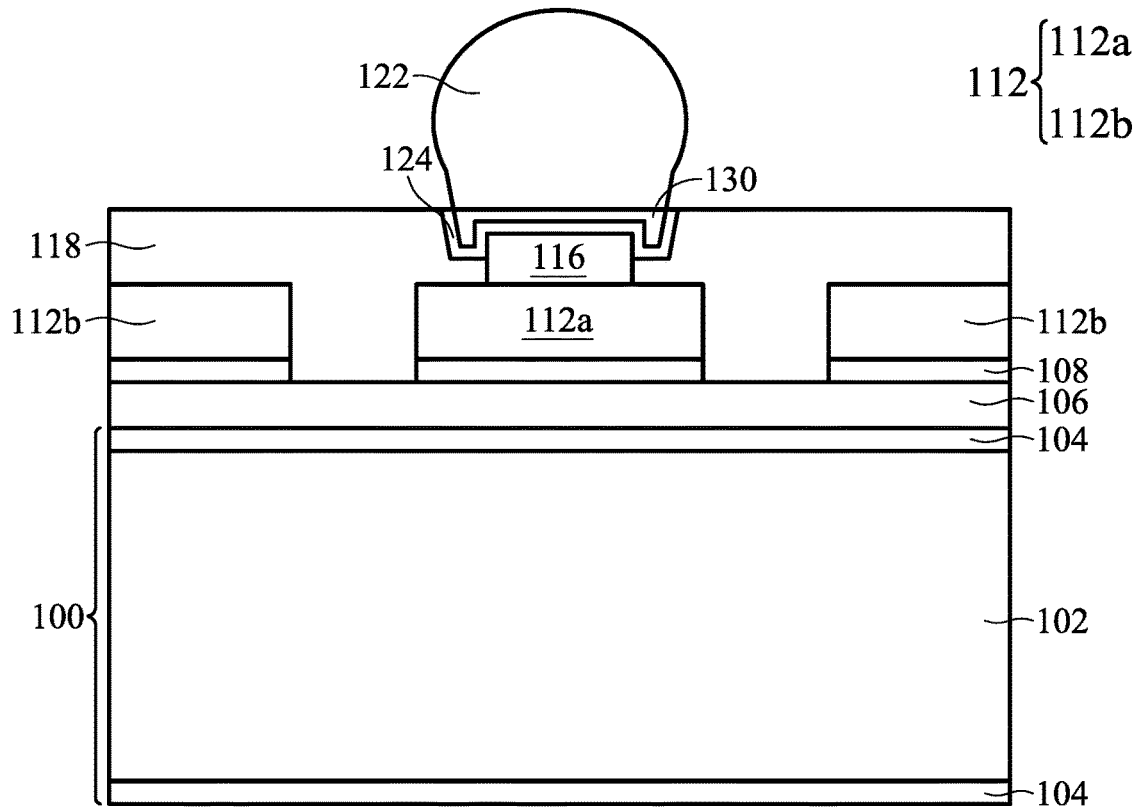

Next, referring to FIG. 5D, a solder material is formed on the metal layer 130. Then, the solder material is heated to form the solder material into a solder bump 122.

In addition to using the first metal pillar 116 to avoid the problem of solder extrusion, this embodiment further uses the conductive layer 124 and the metal layer 130 to make it harder for the solder material to extend to other areas, further avoiding the problem of solder extrusion.

FIGS. 6A to 6D illustrate cross-sectional views of various intermediate phases of forming the circuit board structure in accordance with other embodiments of the present invention. It should be noted that the same or similar elements or layers that correspond to those of FIGS. 1A to 1K are denoted by similar reference numerals. In some embodiments, the elements or layers denoted by the same or similar reference numerals have the same meanings, which will not be repeated for the purpose of simplicity.

Figure 6A:
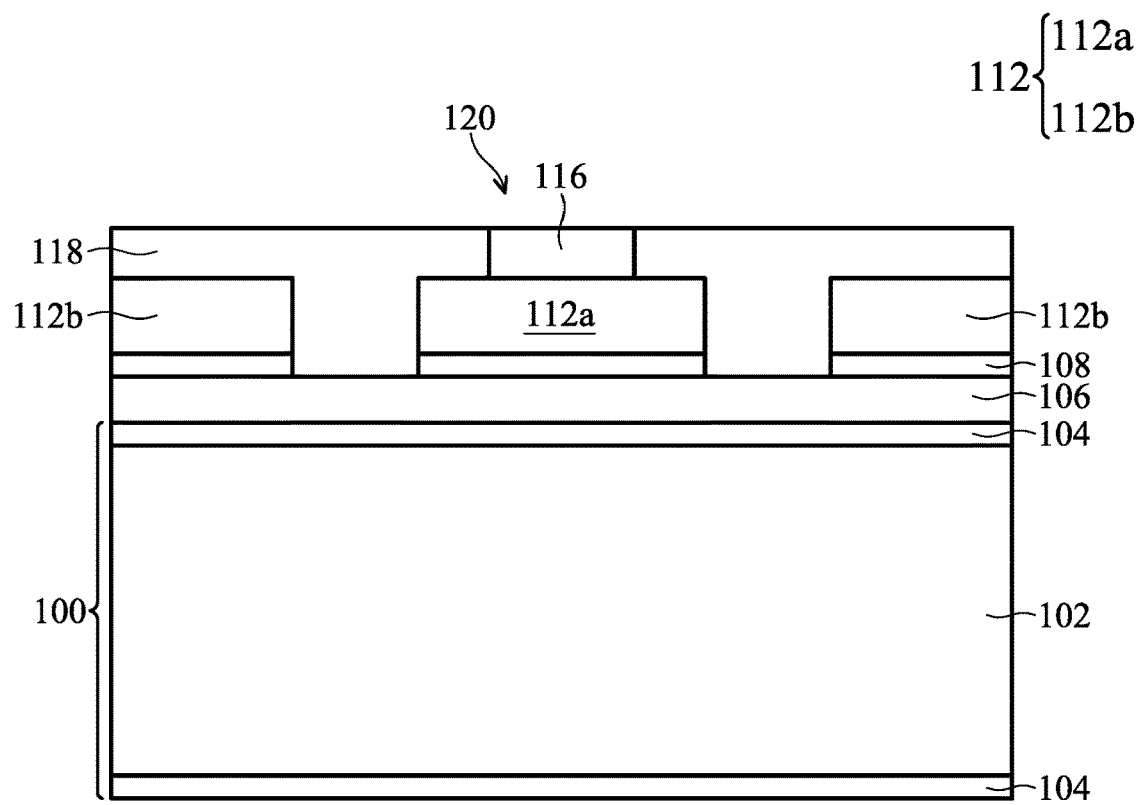
FIGS. 6A to 6D illustrate cross-sectional views of various intermediate phases of forming the circuit board structure in accordance with some embodiments of the present invention.

FIG. 6A follows FIG. 1I. Referring to FIG. 6A, a brush grinding process is performed to remove a portion of the first solder-resist layer 118 to make a top surface of the first metal pillar 116 coplanar with a top surface of the first solder-resist layer 118. In other words, the first solder-resist layer 118 has a first opening 120 exposing the first metal pillar 116. In some embodiments, the brush grinding process also removes a portion of the first metal pillar 116.

Figure 6B:
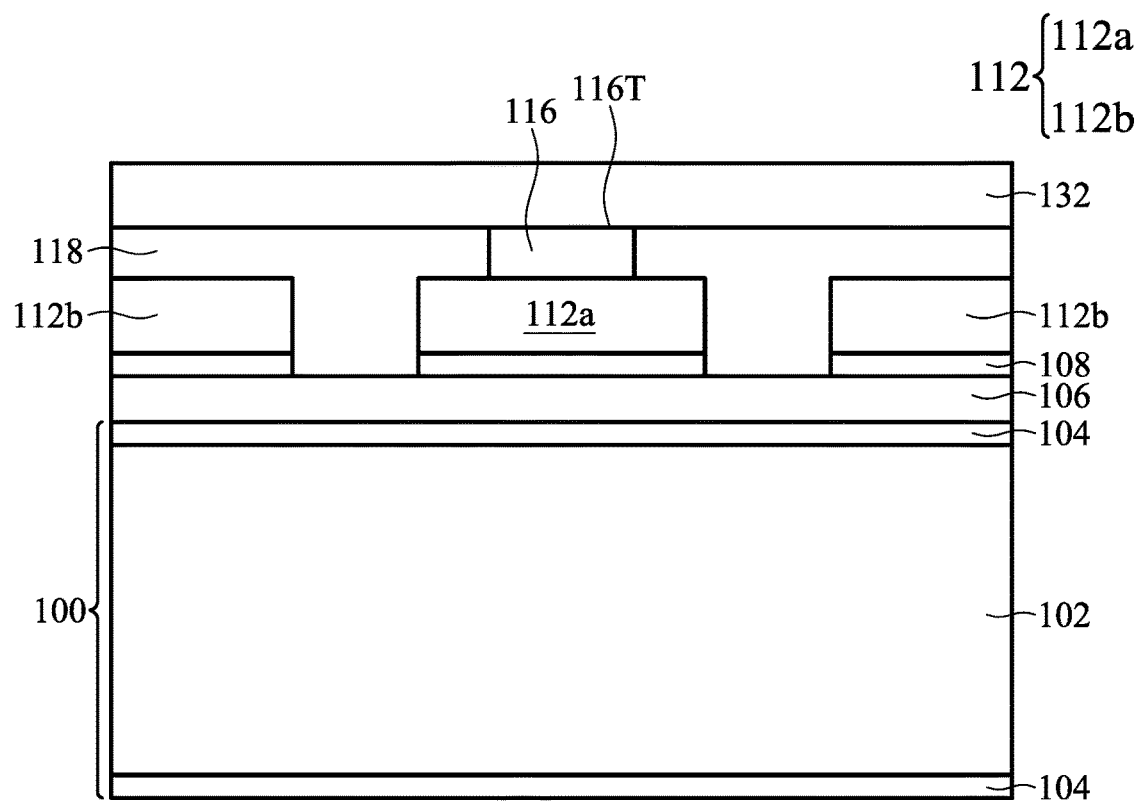

Next, referring to FIG. 6B, a second solder-resist layer 132 is formed on the first solder-resist layer 118 and the first metal pillar 116. In some embodiments, the second solder-resist layer 132 can be formed by coating a photosensitive solder-resist material, such as epoxy resin, carbamic acid, urethane resin or the like, on the first solder-resist layer 118 and the first metal pillar 116, followed by curing the solder-resist material.

Figure 6C:
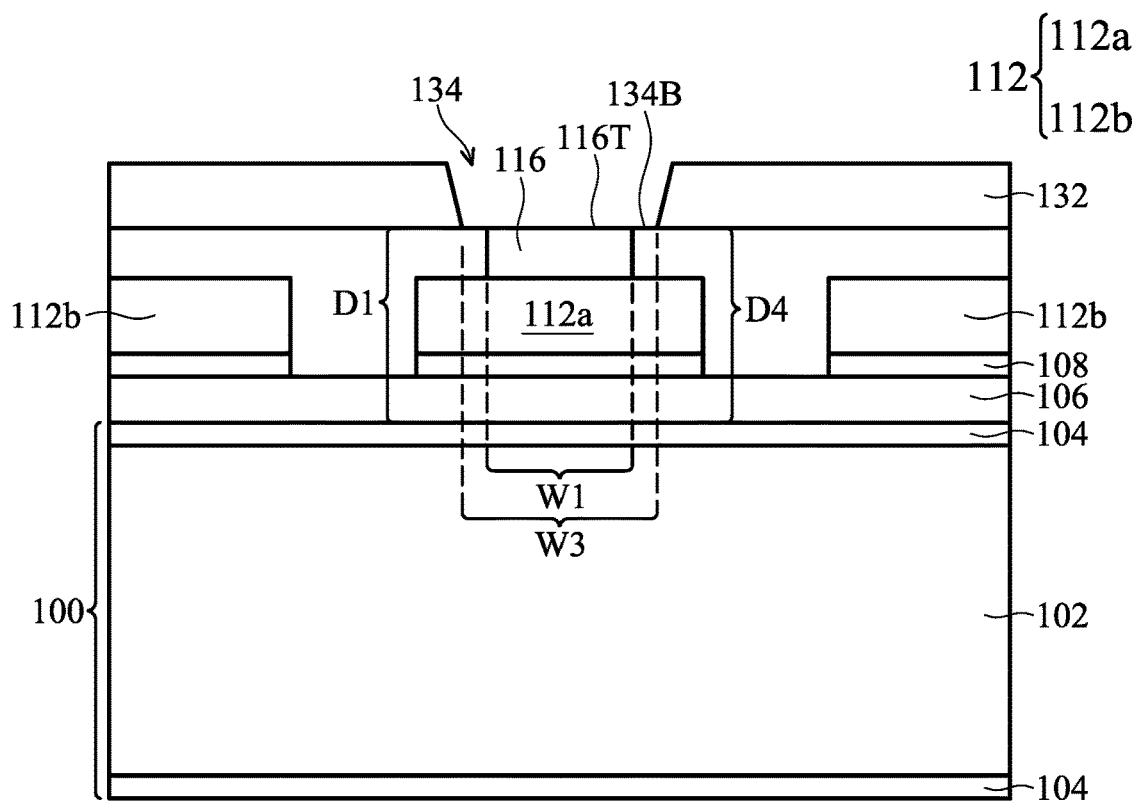

Next, referring to FIG. 6C, a portion of the second solder-resist layer 132 is etched by an etching process to make the second solder-resist layer 132 have a second opening 134 exposing the top surface 116T of the first metal pillar 116. The second opening 134 has a top surface distal from the core substrate 100 and a bottom surface 134B close to the core substrate 100. The top surface 116T of the first metal pillar 116 is coplanar with the bottom surface 134B of the second opening 134. To be specific, there is a first distance D1 between the top surface 116T of the first metal pillar 116 and the top surface of the core substrate 100, and there is a fourth distance D4 between the bottom surface 134B of the second opening 134 and the top surface of the core substrate 100, wherein the first distance D1 is equal to the fourth distance D4.

Figure 6D:
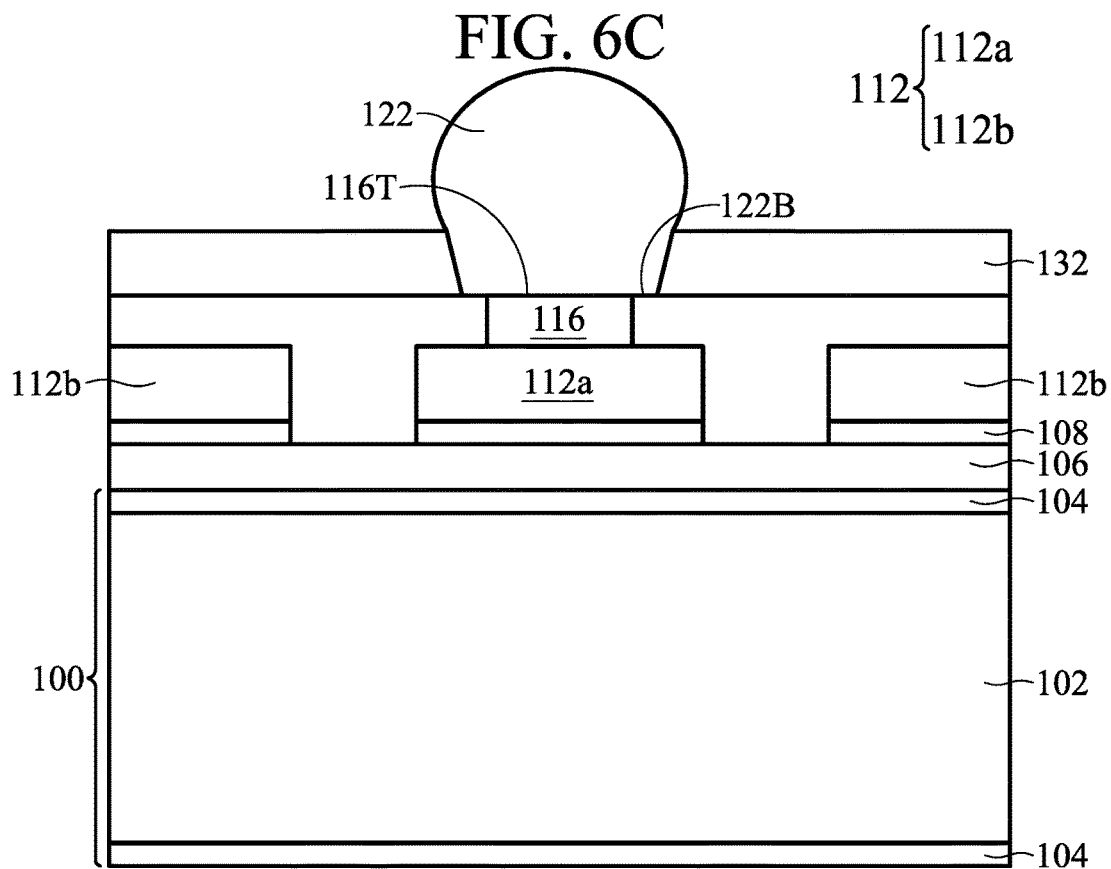

Next, referring to FIG. 6D, a solder material is formed on the first metal layer 116. Then, the solder material is heated to form the solder material into a solder bump 122.

FIGS. 7A to 7F illustrate cross-sectional views of various intermediate phases of forming the circuit board structure in accordance with other embodiments of the present invention. It should be noted that the same or similar elements or layers that correspond to those of FIGS. 1A to 1K are denoted by similar reference numerals. In some embodiments, the elements or layers denoted by the same or similar reference numerals have the same meanings, which will not be repeated for the purpose of simplicity.

Figure 7A:
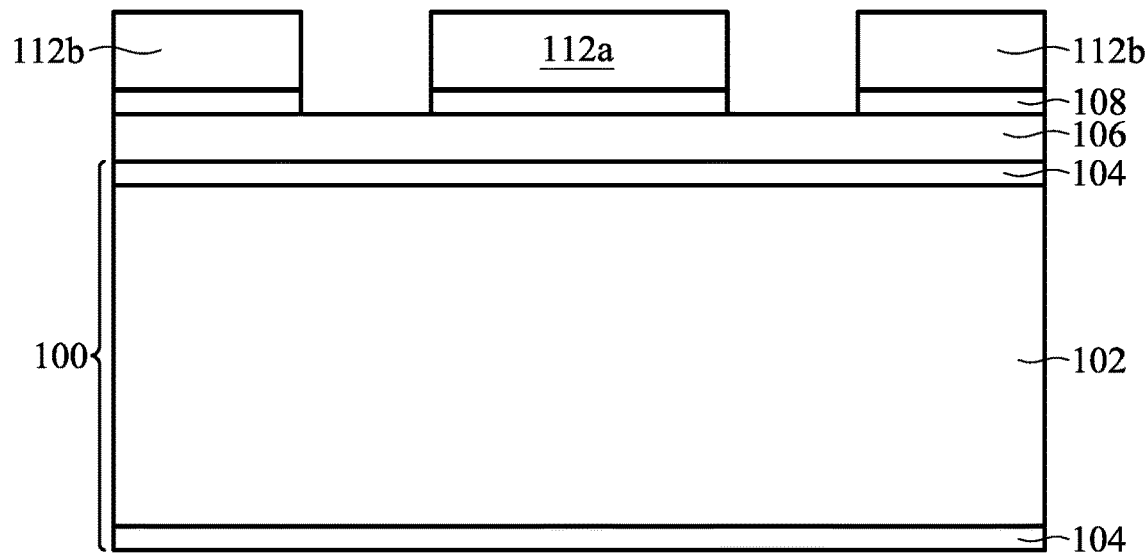
FIGS. 7A to 7G illustrate cross-sectional views of various intermediate phases of forming the circuit board structure in accordance with some embodiments of the present invention.

FIG. 7A is a circuit board structure following FIG. 1C. Referring to FIG. 7A, a stripping process is performed to remove the patterned mask layer 110 till the conductive layer 108 is exposed. In some embodiments, the patterned mask layer 110 can be removed using, for example, NaOH, KOH, other suitable stripping liquids or a combination thereof. Then, an etching process is performed to remove the exposed conductive layer 108.

Figure 7B:
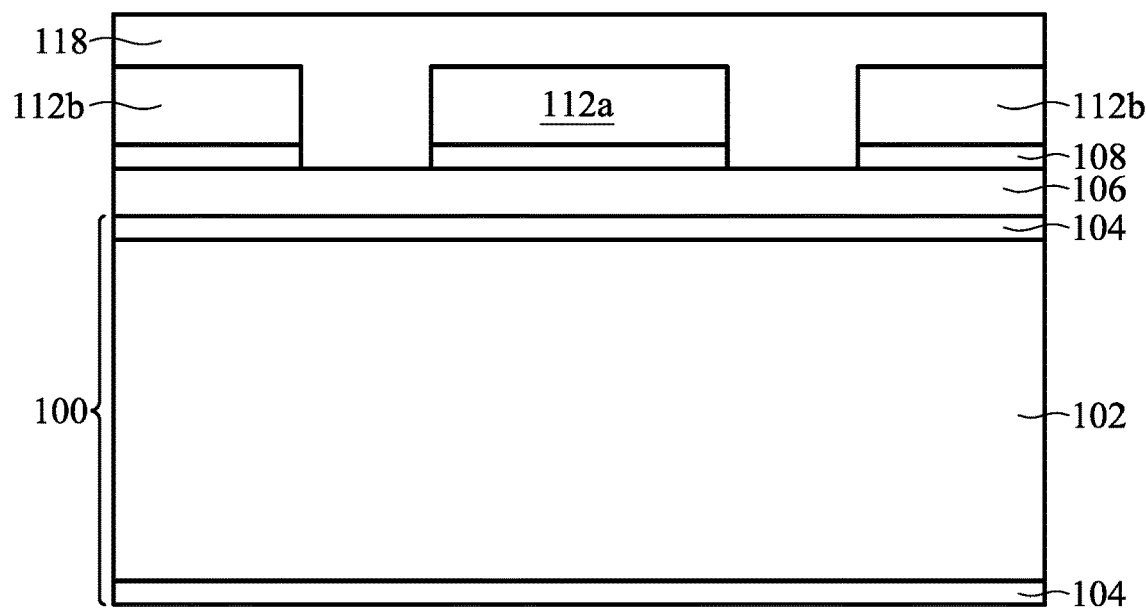

Next, referring to FIG. 7B, a first solder-resist layer 118 is formed on the patterned metal layer 112 and the insulation layer 106. In some embodiments, the first solder-resist layer 118 can be formed by coating a solder-resist material, such as epoxy resin, carbamic acid, urethane resin, ABF or the like, on the patterned metal layer 112 and the insulation layer 106, followed by curing the solder-resist material.

Figure 7C:
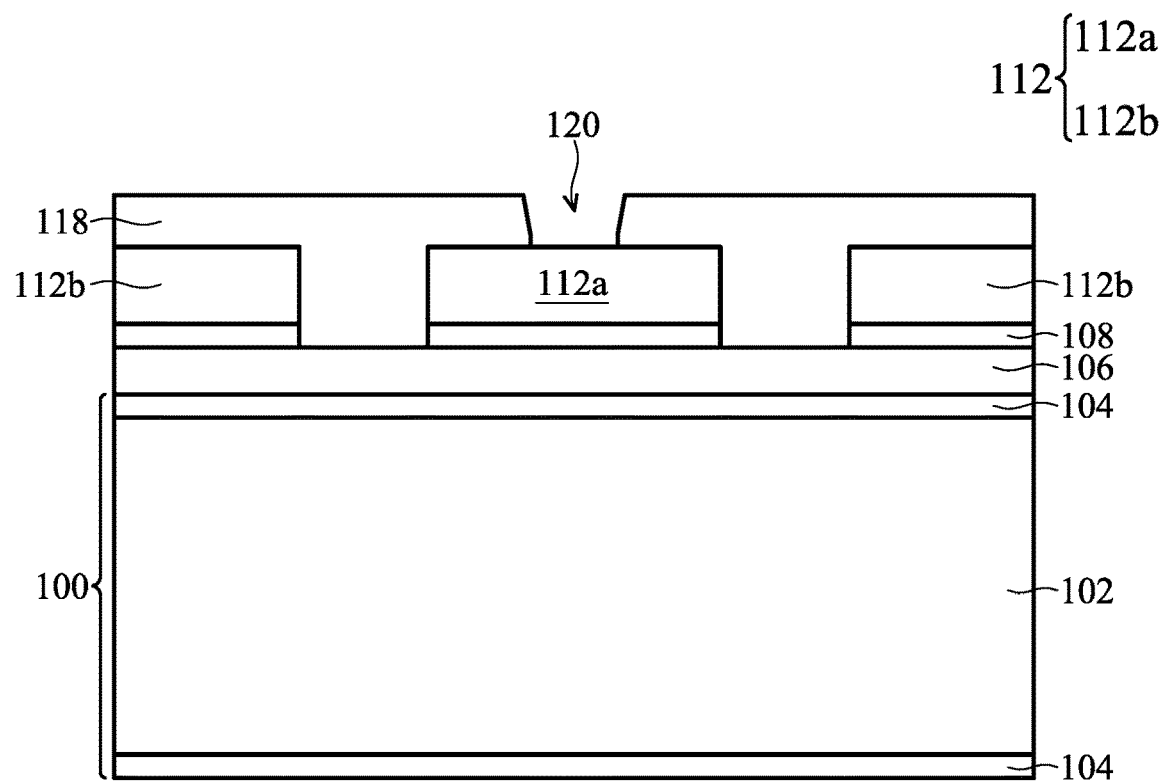

Next, referring to FIG. 7C, in some embodiments, a first opening 120 exposing the pad 112a can be formed downward from a top surface of the first solder-resist layer 118 using a drilling technique, such as mechanical drilling, laser drilling, other suitable methods or a combination thereof.

Figure 7D:
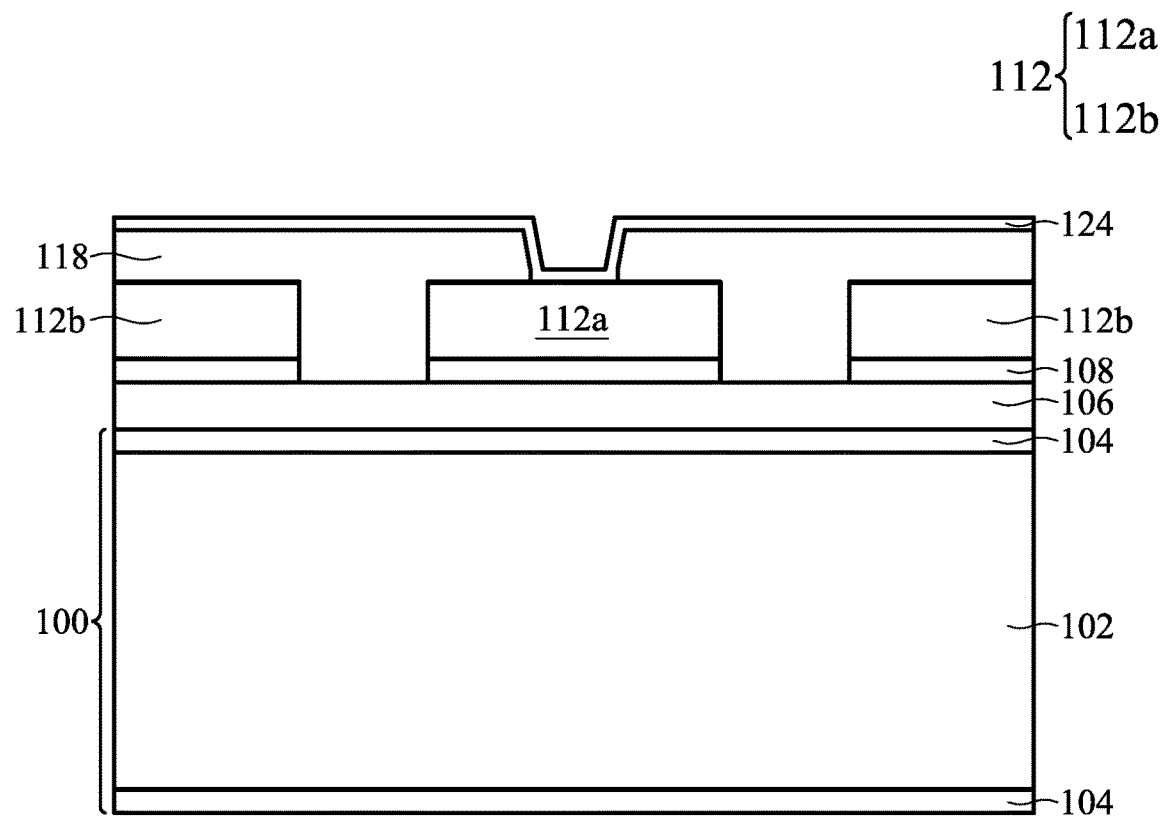

Next, referring to FIG. 7D, a conductive layer 124 is formed on the first solder-resist layer 118 and the pad 112a and in the first opening 120. To be specific, the conductive layer 124 is formed conformally on the surface profile of the circuit board structure. In some embodiments, a material of the conductive layer 124 may include copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof. In some embodiments, the conductive layer 124 can be formed on the first solder-resist layer 118 and the pad 112a and in the first opening 120 using a deposition, lamination or coating process.

Figure 7E:
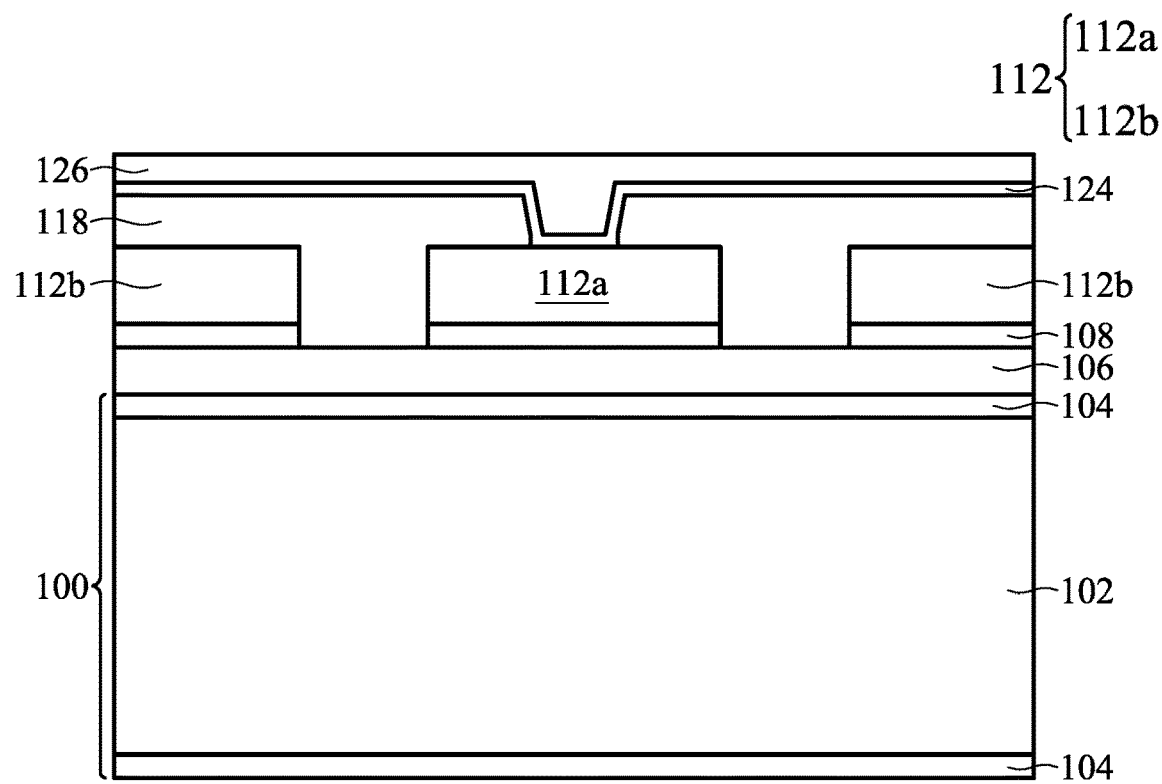

Next, referring to FIG. 7E, a metal layer 126 is formed on the conductive layer 124. For example, the metal layer 126 may include copper, tungsten, silver, tin, nickel, cobalt, chromium, titanium, lead, gold, bismuth, antimony, zinc, zirconium, magnesium, indium, tellurium, gallium, other suitable metal materials, an alloy thereof or a combination thereof. The metal layer 126 can be formed on the conductive layer 124 using a suitable method, such as deposition, electroplating, sputtering, lamination, coating or a combination thereof. In some embodiments, the metal layer 126 can be formed by performing an electroplating process using the conductive layer 124 as an electroplating start layer. In some embodiments, the metal layer 126 can be formed using a deposition process, such as physical deposition process.

Figure 7F:
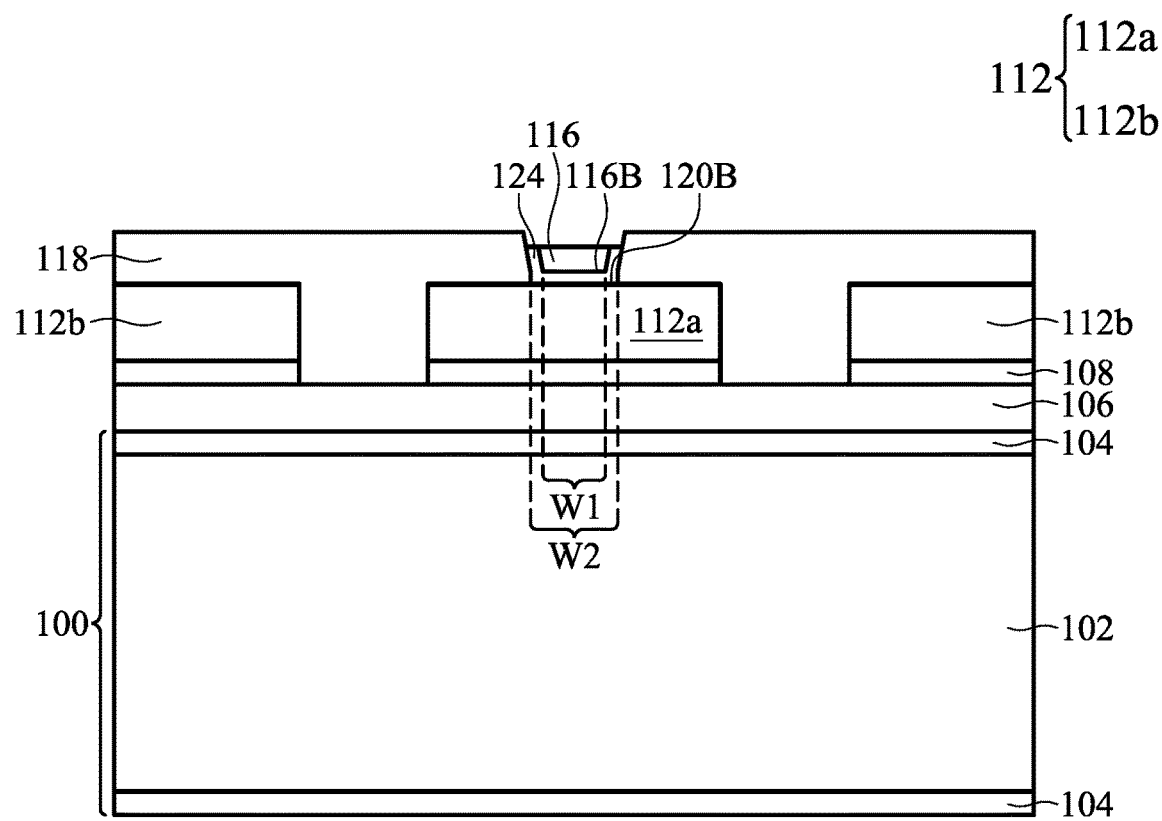

Next, referring to FIG. 7F, a portion of the conductive layer 124 and the metal layer 126 can be removed by an etching process to form the metal layer 126 into a first metal pillar 116 in the first opening 120. In some embodiments, the top surface 116T of the first metal pillar 116 in the first opening 120 is lower than the top surface of the first solder-resist layer 118.

Since the thickness of the conductive layer 124 is extremely small, the thickness of the conductive layer 124 can sometimes be ignored. Therefore, on the same plane of the bottom surface 120B of the first opening 120, a first width W1 of the bottom surface opposite to the top surface 116T of the first metal pillar 116 is approximately smaller than or equal to a second width W2 of the bottom surface 120B of the first opening 120.

Figure 7G:
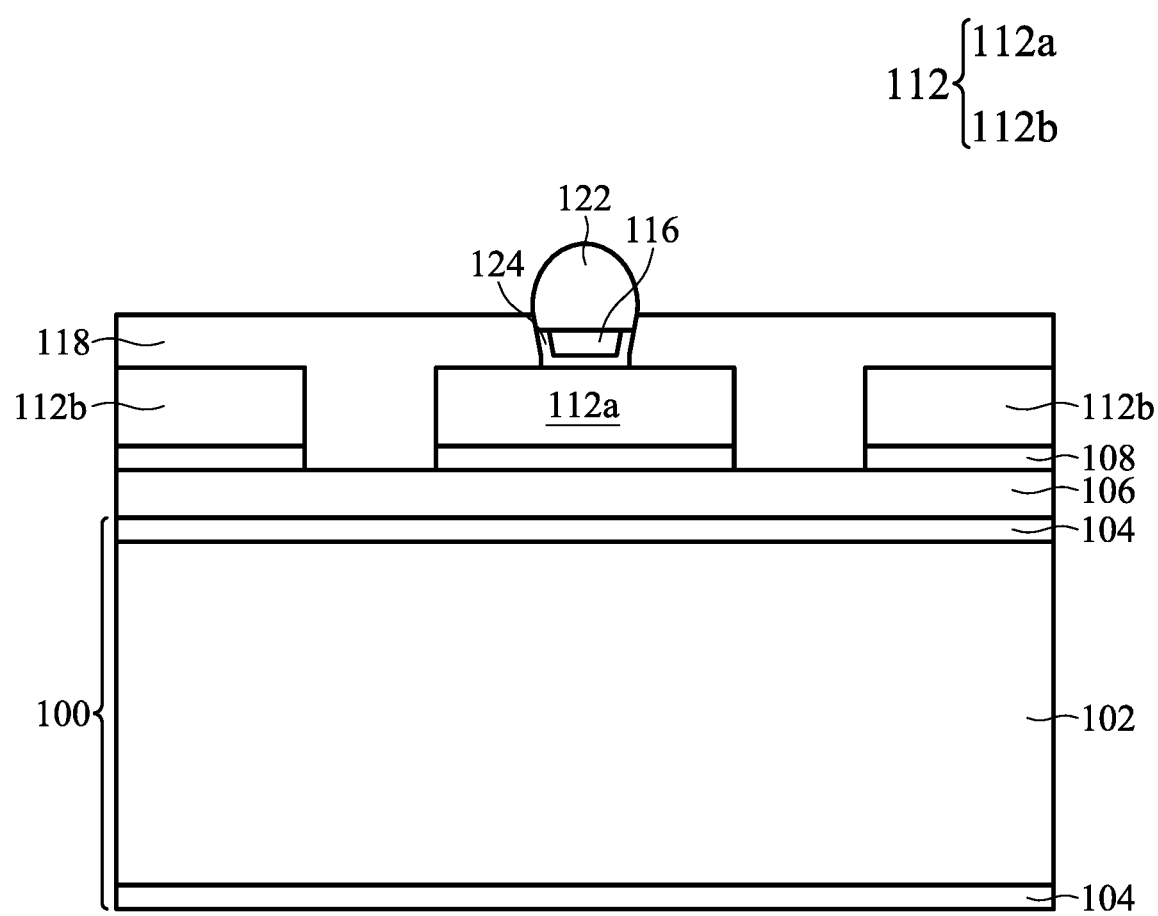

Next, referring to FIG. 7G, a solder material is coated on the metal layer 126. Then, the solder material is heated to form the solder material into a solder bump 122.

In addition to the first metal pillar 116 being formed between the pad 112a and the solder bump 122, the conductive layer 124 is also between the first metal pillar 116 and the first solder-resist layer 118, further avoiding the problem of solder extrusion.

It should be noted that in order to simplify the figures, the embodiments of the present invention only illustrate the outermost structures and the upper halves of the circuit board structures as schematic figures. However, one of ordinary skill in the art can appreciate that other structures, such as interconnect structures, can also be included between the outermost structure and the core substrate, and the same processes can also be performed to the lower half at the same time to save the process time. Alternatively, a different process can be performed depending on the actual situation.

In summary, since the first metal pillar is formed on the pad, when the solder material is subsequently heated, the liquefied solder material can flow along the sidewall of the first metal pillar; in other words, the flow direction of the liquefied solder material is changed from a horizontal direction to a vertical direction. Therefore, there is no unnecessary electrical connection with other elements, thereby avoiding the issue of solder extrusion.

When the top surface of the first metal pillar is higher than the bottom surface of the first opening, the contact area of the soldering surface can be increased, which increases the adhesion between the solder bump and the first metal pillar, thus improving the reliability and yield of the circuit board structure.

Furthermore, since in some embodiments of the present invention, the mask layer is patterned using processes such as exposure, development and so on, and the first metal pillar 116 is then formed, the pitch between the first metal pillars can be further reduced, thereby reducing the size of the circuit board structure.

In addition, forming the metal pillar prior to the formation of the solder bump can further reduce the amount of the solder material filled into the opening of the solder-resist layer. Also, when a reflow process is subsequently performed, there is a self-alignment function, so there is a better alignment function.

The foregoing has outlined some features of the embodiments, so one of ordinary skill in the art can better understand the aspects of the embodiments of the present invention. One of ordinary skill in the art should understand that one can easily use the embodiments of the present invention as a basis for designing or modifying other processes or structures to achieve the same purposes and/or advantages as those described herein. One of ordinary skill in the art should also understand that such equivalent structures do not depart from the spirit and scope of the present invention and that without departing from the spirit and scope of the present invention, changes, replacements and substitutions can be made herein. Accordingly, the scope of the present invention is defined by the scope of the appended claims.

What is claimed is:

1. A circuit board structure, comprising:
a core substrate;
an insulation layer disposed on the core substrate;
a patterned metal layer disposed on the insulation layer, wherein the patterned metal layer comprises a wiring layer and a pad;
a first metal pillar disposed on the pad, and the first metal pillar has a top surface;
a second metal pillar disposed on the wiring layer; and
a first solder-resist layer disposed on the patterned metal layer and the first metal pillar, and the first solder-resist layer has a first opening exposing the first metal pillar and the second metal pillar, and the first opening has a bottom surface, wherein the top surface of the first metal pillar is higher than or equal to the bottom surface of the first opening, and the first metal pillar has an upper portion higher than the bottom surface of the first opening and the upper portion of the first metal pillar is not in direct contact with a sidewall of the first opening.

2. The circuit board structure as claimed in claim 1, wherein on the same plane of the bottom surface of the first opening, the first metal pillar has a first width and the bottom surface of the first opening has a second width, wherein the first width is smaller than or equal to the second width.

3. The circuit board structure as claimed in claim 1, further comprising a second solder-resist layer disposed on the first solder-resist layer and the second solder-resist layer has a second opening exposing the first metal pillar.

4. The circuit board structure as claimed in claim 1, further comprising:
a conductive layer in the first opening; and
a metal layer on the conductive layer.

5. The circuit board structure as claimed in claim 1, further comprising a solder bump disposed on the first metal pillar.

6. The circuit board structure as claimed in claim 1, wherein from a top view, the first metal pillar comprises a shape of a rectangle, a trapezoid, an inverted trapezoid, a T-shape, an inverted L-shape, a zigzag, a cross, a circle, an ellipse or a combination thereof.

7. A method of fabricating a circuit board structure, comprising
providing a core substrate;
forming an insulation layer on the core substrate;
forming a patterned metal layer on the insulation layer, wherein the patterned metal layer comprises a wiring layer and a pad;
forming a first metal pillar on the pad and a second metal pillar on the wiring layer, wherein the first metal pillar has a top surface; and
forming a first solder-resist layer on the patterned metal layer and the first metal pillar, wherein the first solder-resist layer has a first opening exposing the first metal pillar and the second metal pillar, and the first opening has a bottom surface, wherein the top surface of the first metal pillar is higher than or equal to the bottom surface of the first opening, and the first metal pillar has an upper portion higher than the bottom surface of the first opening and the upper portion of the first metal pillar is not in direct contact with a sidewall of the first opening.

8. The method of fabricating a circuit board structure as claimed in claim 7, wherein on the same plane of the bottom surface of the first opening, the first metal pillar has a first width and the bottom surface of the first opening has a second width, wherein the first width is smaller than or equal to the second width.

9. The method of fabricating a circuit board structure as claimed in claim 7, further comprising forming a second solder-resist layer on the first solder-resist layer, wherein the second solder-resist layer has a second opening exposing the first metal layer.

10. The method of fabricating a circuit board structure as claimed in claim 7, further comprising:
forming a conductive layer in the first opening; and
forming a metal layer on the conductive layer.

11. The method of fabricating a circuit board structure as claimed in claim 7, further comprising forming a solder bump on the first metal pillar.

12. The method of fabricating a circuit board structure as claimed in claim 11, wherein the step of forming the solder bump on the first metal pillar comprises:
after the first metal pillar is formed on the pad and before the first solder-resist layer is formed on the patterned metal layer and the first metal pillar, a solder material is formed on the first metal pillar; and
heating the solder material to form the solder material into the solder bump.

13. The method of fabricating a circuit board structure as claimed in claim 7, wherein from a top view, the first metal pillar comprises a shape of a rectangle, a trapezoid, an inverted trapezoid, a T-shape, an inverted L-shape, a zigzag, a cross, a circle, an ellipse or a combination thereof.

14. The method of fabricating a circuit board structure as claimed in claim 7, wherein the pad and the wiring layer comprise the same metal as the first metal layer.

15. The method of fabricating a circuit board structure as claimed in claim 7, wherein the pad and the wiring layer comprise a different metal than that of the first metal layer.

16. The method of fabricating a circuit board structure as claimed in claim 7, wherein the pad and the wiring layer comprise the same metal as the first metal layer.

* * * * *